United States Patent
Chao et al.

(10) Patent No.: US 8,853,748 B2
(45) Date of Patent: Oct. 7, 2014

(54) RECTIFIER WITH VERTICAL MOS STRUCTURE

(71) Applicant: PFC Device Corp., New Taipei (TW)

(72) Inventors: Kuo-Liang Chao, New Taipei (TW);
Mei-Ling Chen, New Taipei (TW);
Hung-Hsin Kuo, New Taipei (TW)

(73) Assignee: PFC Device Corp., New Taipei (TW)

( * ) Notice: Subject to any disclaimer, the term of this patent is extended or adjusted under 35 U.S.C. 154(b) by 0 days.

(21) Appl. No.: 14/150,236

(22) Filed: Jan. 8, 2014

(65) Prior Publication Data

US 2014/0131793 A1    May 15, 2014

Related U.S. Application Data

(62) Division of application No. 13/446,327, filed on Apr. 13, 2012, now Pat. No. 8,664,701.

(30) Foreign Application Priority Data

Apr. 15, 2011 (TW) .............................. 100113255 A

(51) Int. Cl.
*H01L 21/02* (2006.01)
*H01L 21/322* (2006.01)

(52) U.S. Cl.
USPC ......................................... 257/284; 438/576

(58) Field of Classification Search
USPC ................................ 257/280–284, 109, 476, 257/E29.041–E29.149; 438/169, 576
See application file for complete search history.

(56) References Cited

U.S. PATENT DOCUMENTS

| 5,365,102 | A | 11/1994 | Mehrotra et al. |
| 8,304,766 | B2 * | 11/2012 | Lin et al. .......................... 257/48 |
| 8,664,701 | B2 * | 3/2014 | Chao et al. ..................... 257/284 |
| 2011/0198589 | A1 | 8/2011 | Lin et al. |
| 2013/0228891 | A1 | 9/2013 | Kao et al. |

* cited by examiner

*Primary Examiner* — Calvin Lee
(74) *Attorney, Agent, or Firm* — WPAT, PC; Justin King

(57) ABSTRACT

A method for manufacturing a rectifier with a vertical MOS structure is provided. A first trench structure and a first mask layer are formed at a first side of the semiconductor substrate. A second trench structure is formed in the second side of the semiconductor substrate. A gate oxide layer, a polysilicon structure and a metal sputtering layer are sequentially formed on the second trench structure. The rectifier further includes a wet oxide layer and a plurality of doped regions. The wet oxide layer is formed on a surface of the first multi-trench structure and in the semiconductor substrate. The doping regions are formed on a region between the semiconductor substrate and the second trench structure, and located beside the mask layer. The metal sputtering layer is formed on the first mask layer corresponding to the first trench structure.

10 Claims, 20 Drawing Sheets

RECTIFIER WITH VERTICAL MOS STRUCTURE

This is a divisional application of U.S. patent application Ser. No. 13/446,327, filed Apr. 13, 2012, now U.S. Pat. No. 8,664,701 issued Mar. 4, 2014, which claims the benefit of Taiwan Application Serial No. 100113255, filed on Apr. 15, 2011, the subject matter of these applications is incorporated herein by reference.

FIELD OF THE INVENTION

The present invention relates to a rectifier with a vertical MOS structure, and more particularly to a rectifier with a vertical MOS structure which has low reverse-biased leakage current, low forward voltage drop, high reverse voltage and fast reverse recovery time. The present invention also relates to a method for manufacturing such a rectifier.

BACKGROUND OF THE INVENTION

A Schottky diode is a unipolar device using electrons as carriers, which is characterized by high switching speed and low forward voltage drop. The limitations of Schottky diodes are the relatively low reverse voltage tolerance and the relatively high reverse leakage current. The limitations are related to the Schottky barrier determined by the metal work function of the metal electrode, the band gap of the intrinsic semiconductor, the type and concentration of dopants in the semiconductor layer, and other factors. Recently, a trench-MOS Schottky barrier diode has been disclosed. In the trench-MOS Schottky barrier diode, a trench filled with polysilicon or metallic material is used for pinching the reverse-biased leakage current and thus largely reducing the leakage current of the semiconductor device.

A trench-MOS Schottky barrier diode has been disclosed in U.S. Pat. No. 5,365,102, which is entitled "SCHOTTKY BARRIER RECTIFIER WITH MOS TRENCH". Please refer to FIGS. 1A~1F, which schematically illustrate a method of manufacturing a conventional trench MOS Schottky barrier diode.

Firstly, as shown in FIG. 1A, a semiconductor substrate 12 with an epitaxial layer thickness is provided. The substrate 12 has two surfaces 12a and 12b. A heavily-doped (N+ type) cathode region 12c is adjacent to the surface 12a. A lightly-doped (N type) drift region 12d is extended from the heavily-doped (N+ type) cathode region 12c to the surface 12b. A silicon dioxide ($SiO_2$) layer 13 is grown on the substrate 12. A silicon nitride ($Si_3N_4$) layer 15 is grown on the silicon dioxide layer 13. The formation of the silicon dioxide layer 13 may reduce the stress that is provided by the silicon nitride layer 15. Moreover, a photoresist layer 17 is formed on the silicon nitride layer 15.

Then, as shown in FIG. 1B, a photolithography and etching process is performed to pattern the photoresist layer 17 and partially remove the silicon nitride layer 15, the silicon dioxide layer 13 and the substrate 12. Consequently, a plurality of discrete mesas 14 are defined in the drift region 12d of the substrate 12. In addition, the etching step defines a plurality of trenches 22. Each trench 22 has a specified depth and a specified width. Then, as shown in FIG. 1C, a thermal oxide layer 16 is formed on a sidewall 22a and a bottom 22b of the trench 22. Then, as shown in FIG. 1D, the remaining silicon nitride layer 15 and the remaining silicon dioxide layer 13 are removed. Then, as shown in FIG. 1E, a metallization layer 23 is formed over the resulting structure of FIG. 1D. Then, as shown in FIG. 1F, a metallization process is performed to form another metallization layer (not shown) on the backside surface 12a. After a thermal treatment process is performed, the metallization layer 23 contacted with the discrete mesas 14 are connected with each other to define a single anode electrode layer 18, and a cathode electrode 20 on the backside surface 12a, and a cathode electrode layer 20 is formed on the backside surface 12a. Since the anode electrode layer 18 is contacted with the mesas 14, a so-called Schottky barrier results in a Schottky contact. Meanwhile, the trench MOS Schottky barrier diode is produced.

The trench MOS Schottky barrier rectifier (TMBR) fabricated by the above method has low forward voltage drop. Moreover, since the reverse-biased leakage current is pinched by the trench, the leakage current is reduced when compared with the Schottky diode having no trenches. However, this rectifier still has some drawbacks. For example, the processes of creating the trenches may result in stress. If the stress is not properly adjusted, the rectifier is readily damaged during the reliability test is performed. Moreover, during operation of the rectifier, the rectifier may has malfunction because the stress may result in a tiny crack in the rectifier.

SUMMARY OF THE INVENTION

A first embodiment of the present invention provides a rectifier with a vertical MOS structure, the rectifier comprising: a semiconductor substrate, wherein a first multi-trench structure is formed in a first side of the semiconductor substrate, and a second multi-trench structure is formed in a second side of the semiconductor substrate; a first mask layer formed on the first side of the semiconductor substrate corresponding to the first multi-trench structure; a wet oxide layer extended from a periphery of the first multi-trench structure into the semiconductor substrate; a second mask layer formed on sidewalls of the first mask layer and the wet oxide layer corresponding to the first multi-trench structure; a gate oxide layer formed on a surface of the second multi-trench structure; a polysilicon structure, wherein a first part of the polysilicon structure is formed on a sidewall of the second mask layer corresponding to the first multi-trench structure, and a second part of the polysilicon structure is formed on the gate oxide layer corresponding to the second multi-trench structure; a plurality of doping regions formed on a region between the semiconductor substrate and the second multi-trench structure, and located beside the first mask layer; and a metal sputtering layer formed on the doped regions, the gate oxide layer and the second part of the polysilicon structure corresponding to the second multi-trench structure, and formed on the first mask layer, the second mask layer, the first part of the polysilicon structure and the wet oxide layer corresponding to the first multi-trench structure, wherein the a part of the first mask layer is exposed.

A second embodiment of the present invention provides a rectifier with a vertical MOS structure, the rectifier comprising: a semiconductor substrate, wherein a first multi-trench structure is formed in a first side of the semiconductor substrate, and a second multi-trench structure is formed in a second side of the semiconductor substrate; a wet oxide layer formed on a surface of the first multi-trench structure and in the semiconductor substrate; a mask layer formed on the first side of the semiconductor substrate corresponding to the first multi-trench structure and formed on the wet oxide layer; a gate oxide layer formed on a surface of the second multi-trench structure; a polysilicon structure formed on the gate oxide layer; a plurality of doping regions formed on a region between the semiconductor substrate and the second multi-trench structure, and located beside the mask layer; and a metal sputtering layer formed on the doped regions, the gate oxide layer and the polysilicon structure corresponding to the second multi-trench structure, and formed on the mask layer corresponding to the first multi-trench structure, wherein the mask layer is exposed.

A third embodiment of the present invention provides a rectifier with a vertical MOS structure, the rectifier comprising: a semiconductor substrate, wherein a first multi-trench structure is formed in a first side of the semiconductor substrate, and a second multi-trench structure is formed in a second side of the semiconductor substrate; a wet oxide layer formed on a surface of the first multi-trench structure and in the semiconductor substrate; a mask layer formed on the first side of the semiconductor substrate corresponding to the first multi-trench structure and formed on the wet oxide layer; a gate oxide layer formed on a surface of the second multi-trench structure; a gate dielectric layer formed on a part of a surface of the gate oxide layer; a first polysilicon structure formed on the gate dielectric layer; a polysilicon oxide layer formed on the first polysilicon structure; a second polysilicon structure formed on the gate dielectric layer and the polysilicon oxide layer; a plurality of doping regions formed on a region between the semiconductor substrate and the second multi-trench structure, and located beside the mask layer; and a metal sputtering layer formed on the doped regions, the gate oxide layer and the second polysilicon structure corresponding to the second multi-trench structure, and formed on the mask layer corresponding to the first multi-trench structure, wherein the mask layer is exposed.

A fourth embodiment of the present invention provides a rectifier with a vertical MOS structure, the rectifier comprising: a semiconductor substrate, wherein a first multi-trench structure is formed in a first side of the semiconductor substrate, and a second multi-trench structure is formed in a second side of the semiconductor substrate; a first mask layer formed on the first side of the semiconductor substrate corresponding to the first multi-trench structure; a wet oxide layer extended from a periphery of the first multi-trench structure into the semiconductor substrate; a second mask layer formed on sidewalls of the first mask layer and the wet oxide layer corresponding to the first multi-trench structure; a gate oxide layer formed on a surface of the second multi-trench structure; a gate dielectric layer, wherein a first part of the gate dielectric layer is formed on a sidewall of the second mask layer corresponding to the first multi-trench structure, and a second part of the gate dielectric layer is formed on a surface of the first gate oxide layer corresponding to the second multi-trench structure; a first polysilicon structure, wherein a first part of the first polysilicon structure is formed on a sidewall of the gate dielectric layer corresponding to the first multi-trench structure, and a second part of the first polysilicon structure is formed on the second part of the gate dielectric layer corresponding to the second multi-trench structure; a polysilicon oxide layer formed on the second part of the first polysilicon structure; a second polysilicon structure formed on the polysilicon oxide layer and the second part of the gate dielectric layer; a plurality of doping regions formed on a region between the semiconductor substrate and the second multi-trench structure, and located beside the first mask layer; and a metal sputtering layer formed on the doped regions, the gate oxide layer and the second polysilicon structure corresponding to the second multi-trench structure, and formed on the first mask layer, the second mask layer, the first part of the gate dielectric layer, the first part of the first polysilicon structure and the wet oxide layer corresponding to the first multi-trench structure, wherein the a part of the first mask layer is exposed.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1A:
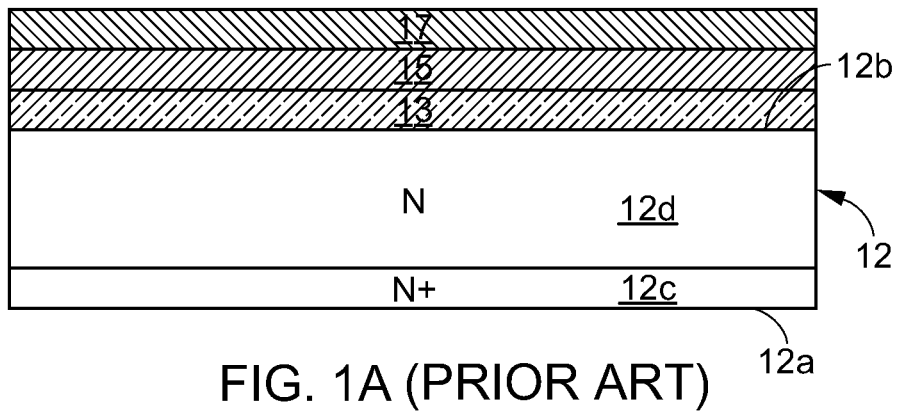
FIGS. 1A~1F (prior art) illustrate a method of manufacturing a conventional trench MOS Schottky barrier diode.
Figure 1B:
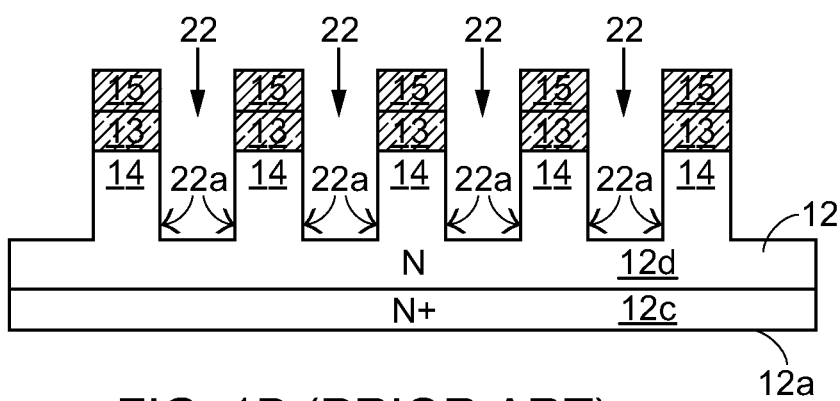
Figure 1C:
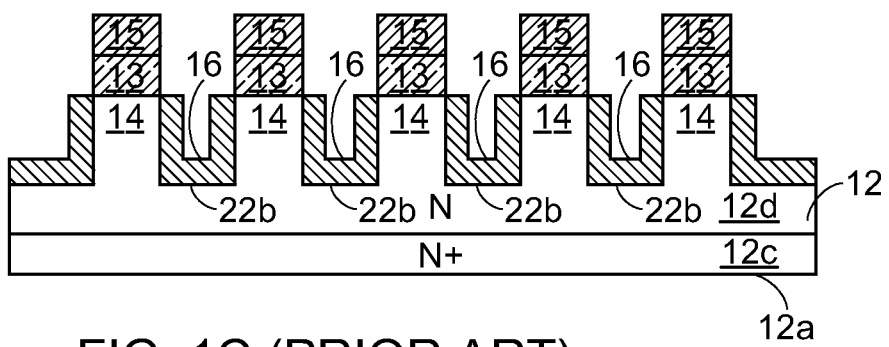
Figure 1D:
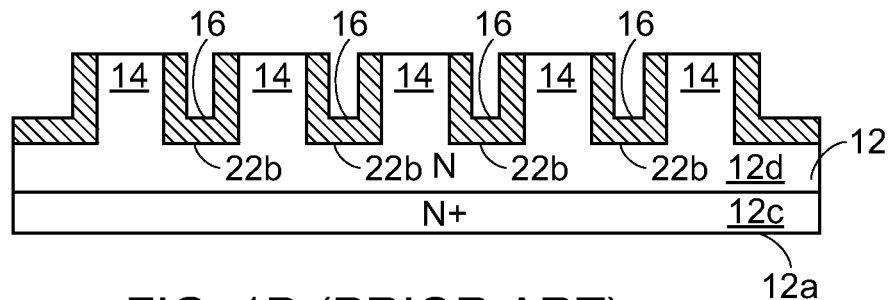
Figure 1E:
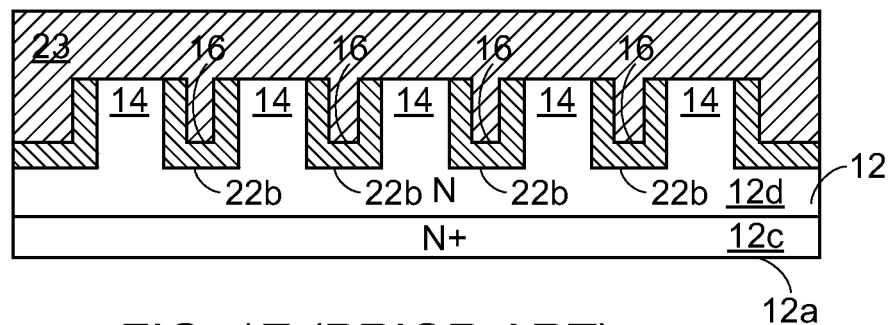
Figure 1F:
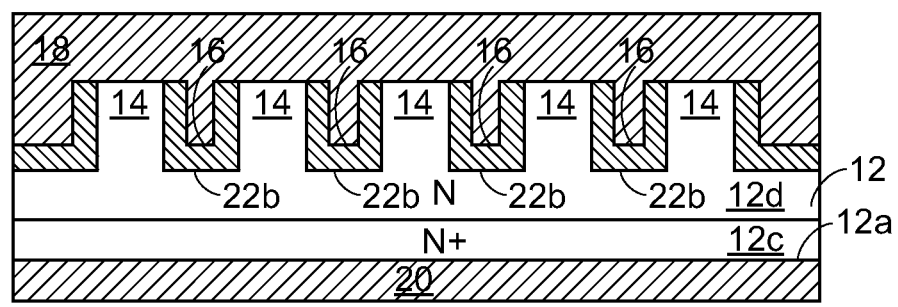
Figure 2A:
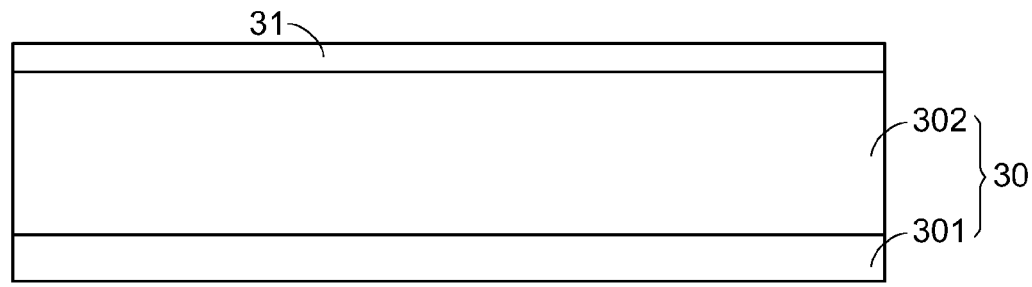
FIGS. 2A~2P schematically illustrate a method of manufacturing a rectifier with a vertical MOS structure according to a first embodiment of the present invention.
Figure 2B:
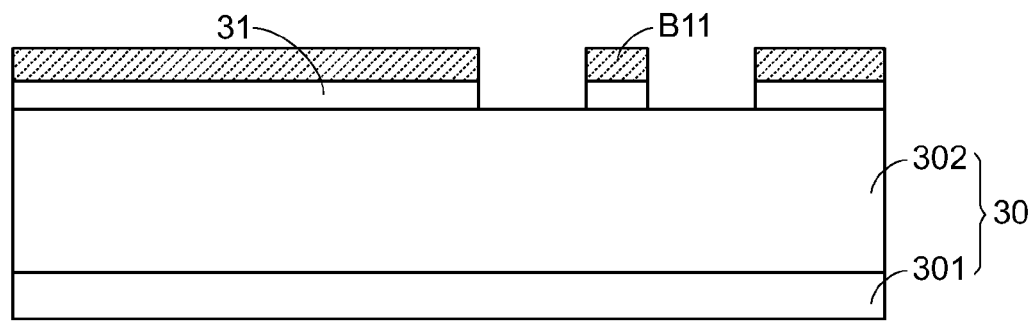
Figure 2C:
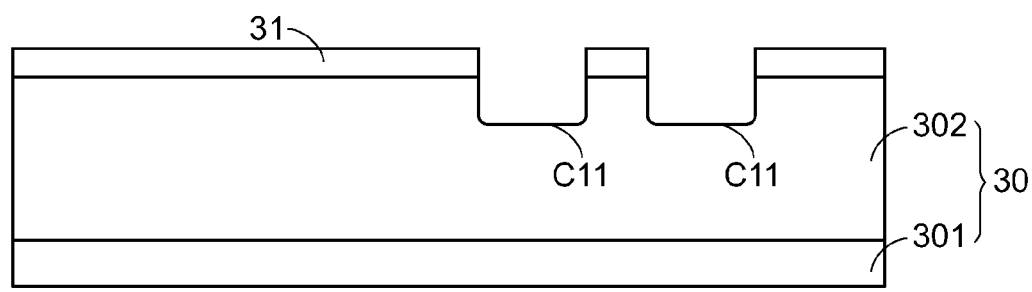
Figure 2D:
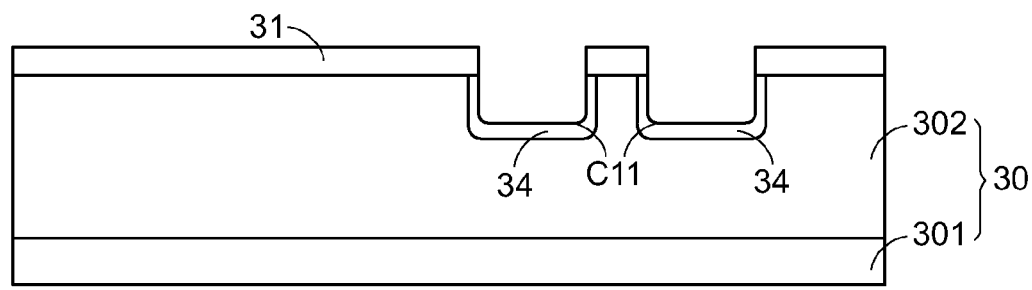
Figure 2E:
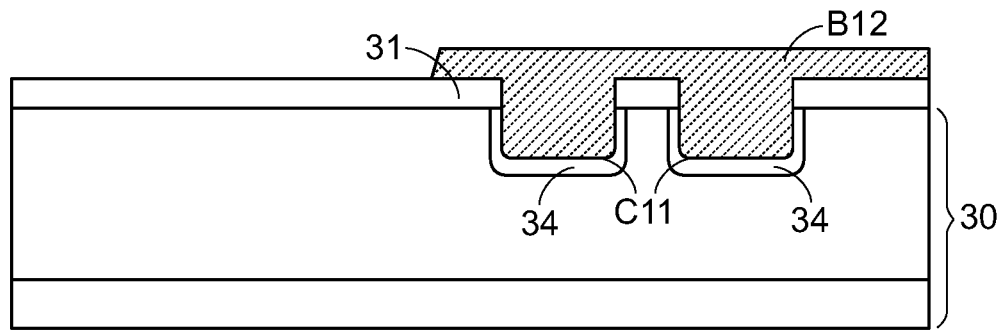
Figure 2F:
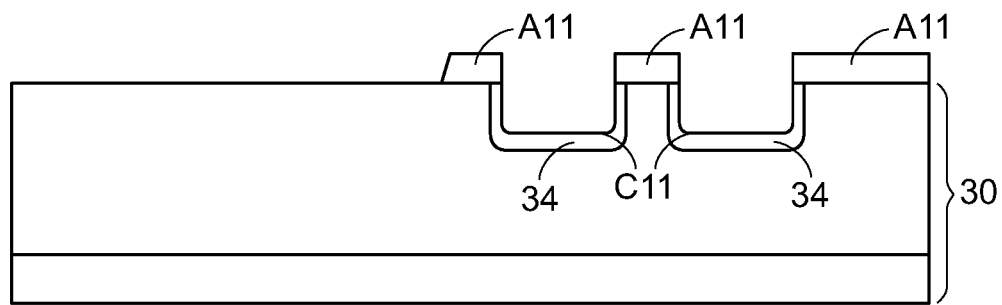
Figure 2G:
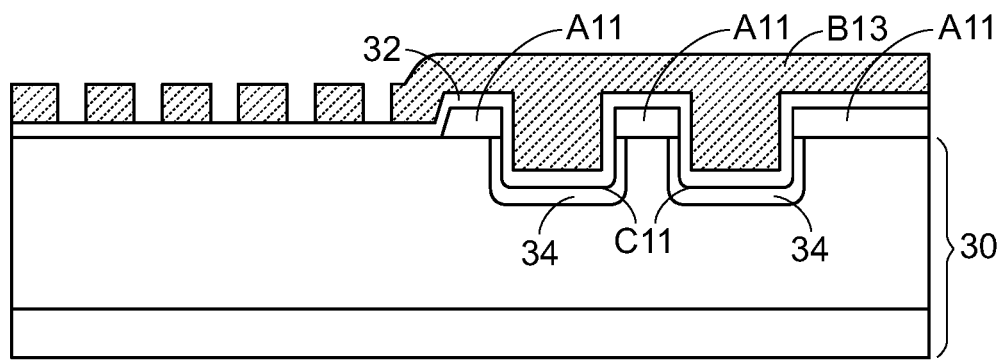
Figure 2H:
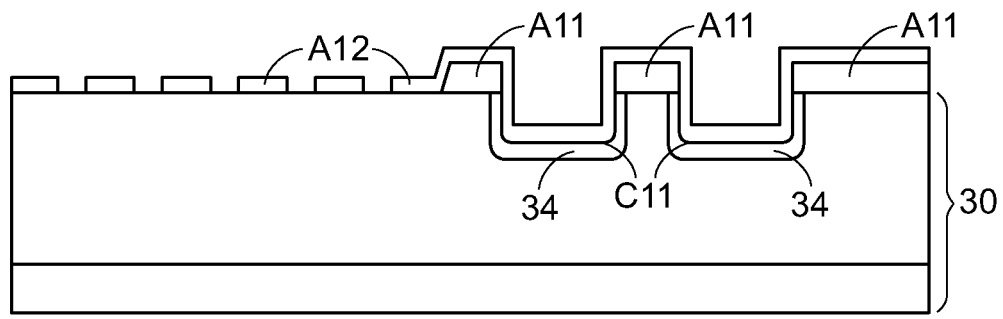
Figure 2I:
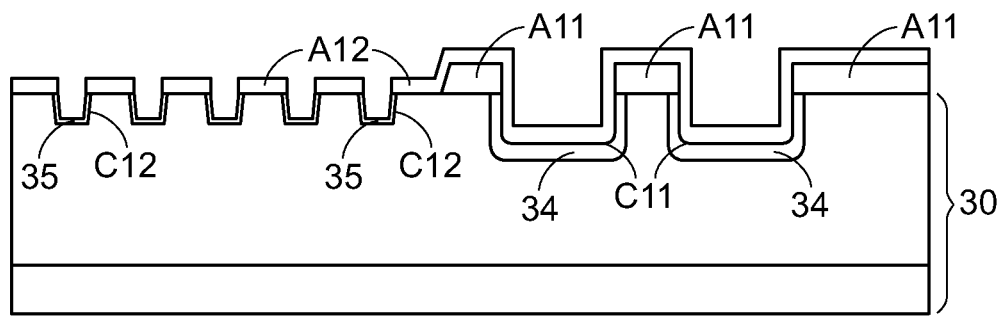
Figure 2J:
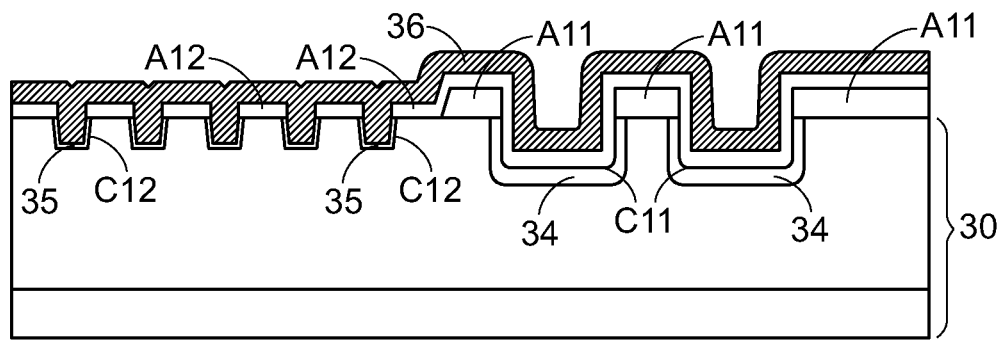
Figure 2K:
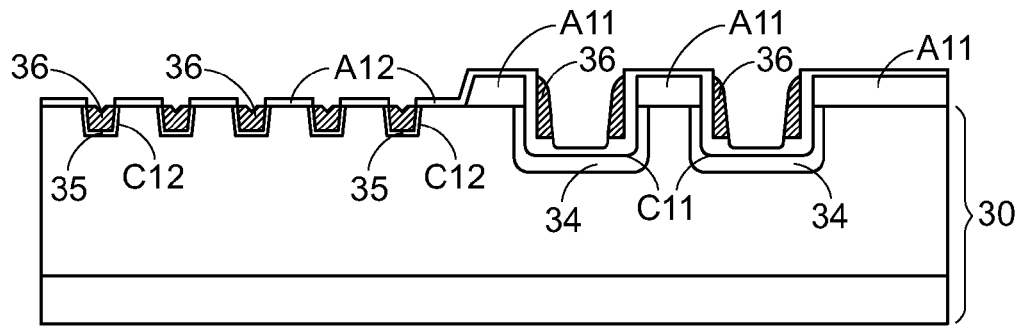
Figure 2L:
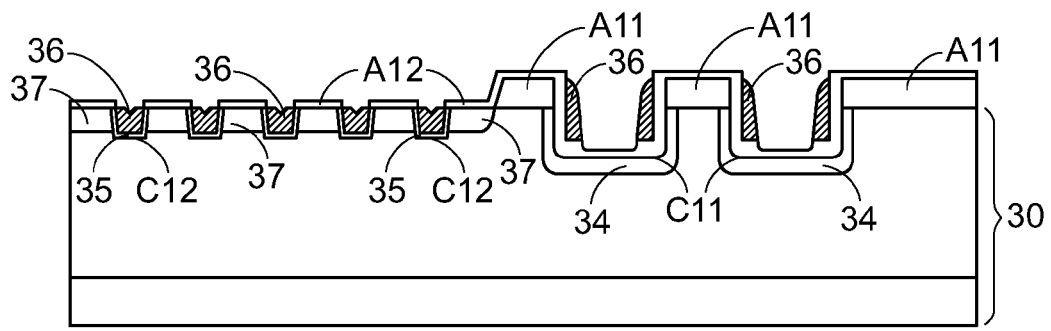
Figure 2M:
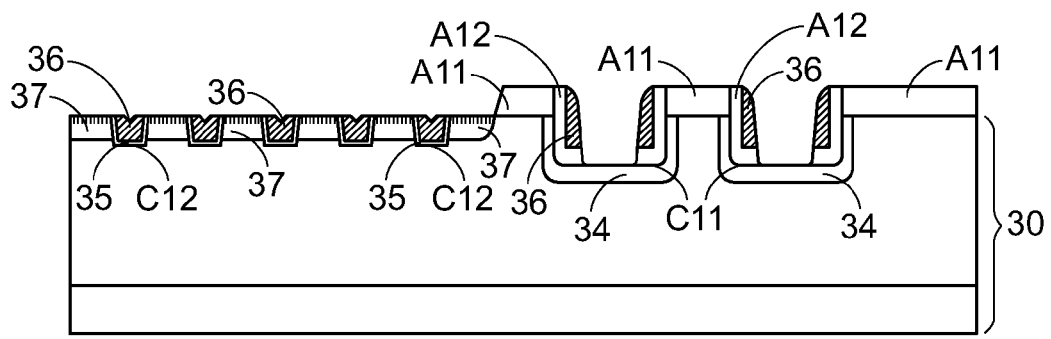
Figure 2N:
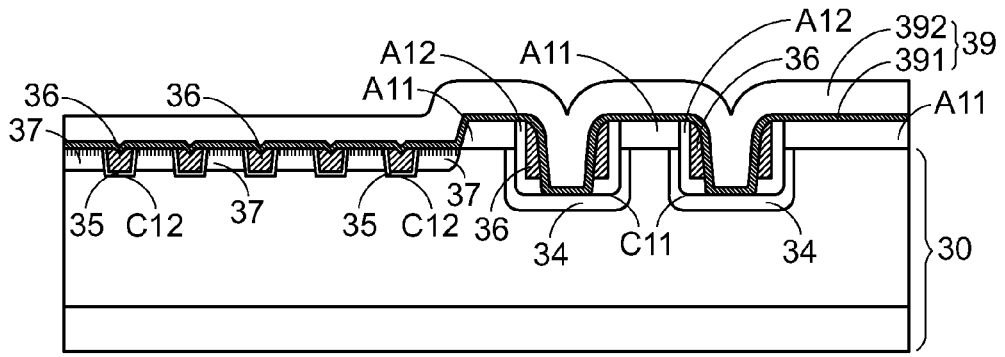
Figure 2O:
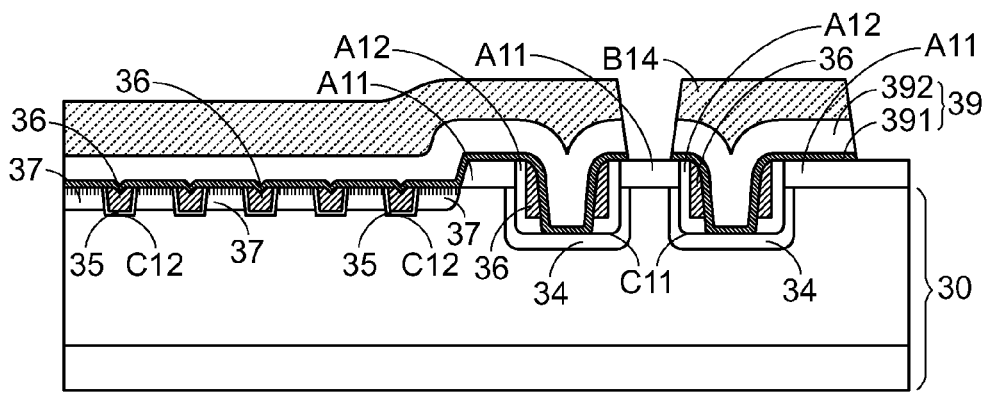
Figure 2P:
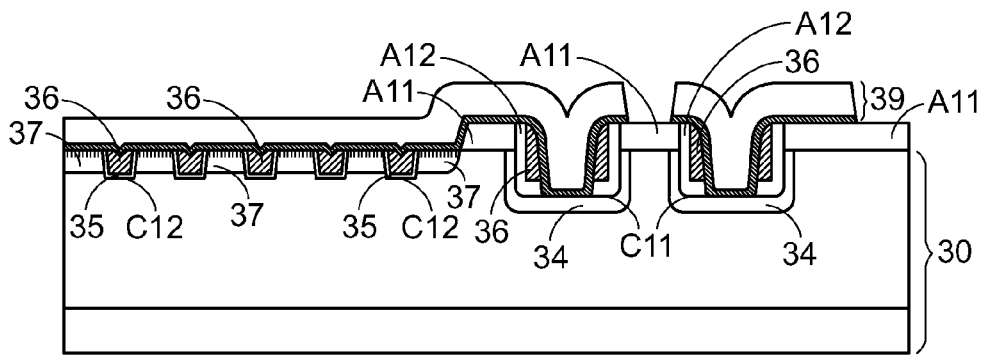

Please refer to FIGS. 2A~2P, which schematically illustrate a method of manufacturing a rectifier with a vertical MOS structure according to a first embodiment of the present invention.

Firstly, as shown in FIG. 2A, a semiconductor substrate 30 is provided. The semiconductor substrate 30 comprises a heavily-doped (N+ type) silicon layer 301 and a lightly-doped (N type) epitaxial layer 302. The lightly-doped epitaxial layer 302 is formed on the heavily-doped silicon layer 301. Moreover, the lightly-doped epitaxial layer 302 has a specified thickness for facilitating defining a plurality of trenches in the subsequent etching process.

Then, a thermal oxidation process is carried out, and thus a first oxide layer 31 is formed on a surface of the lightly-doped epitaxial layer 302. In this embodiment, the thickness of the first oxide layer 31 is 6000 angstroms. The first oxide layer 31 may be used as a mask layer in the subsequent processes.

Then, as shown in FIG. 2B, a first photoresist layer B11 with a first photoresist pattern is formed on the first oxide layer 31. According to the first photoresist layer B11, the first oxide layer 31 is etched to have the first photoresist pattern, so that the first photoresist pattern is transferred to the first oxide layer 31. After the first oxide layer 31 is etched to have the first photoresist pattern, the first oxide layer 31 may be used as a hard mask for defining the trenches.

After the first photoresist pattern is transferred to the first oxide layer 31, the first photoresist layer B11 is removed. Then, as shown in FIG. 2C, by using the first oxide layer 31 as an etch mask, a trench etching process is performed to form a first multi-trench structure C11 in the semiconductor substrate 30. Since the first photoresist pattern is located at a first side of the semiconductor substrate 30 (e.g. the right side of the wafer as shown in FIGS. 2B and 2C), the first multi-trench structure C11 is formed in the first side (i.e. the right side) of the semiconductor substrate 30. The first multi-trench structure C11 comprises a plurality of trenches. For clarification and brevity, the first multi-trench structure C11 with two identical trenches is shown in the drawings.

Then, as shown in FIG. 2D, a wet oxidation process is performed to form a wet oxide layer 34 from the periphery of the first multi-trench structure C11 into the semiconductor substrate 30. That is, the wet oxidation process is performed to form the wet oxide layer 34 from an interface between the first multi-trench structure C11 and the semiconductor substrate 30 to the semiconductor substrate 30. In this embodiment, the thickness of the wet oxide layer 34 is about 4000 angstroms.

Then, as shown in FIG. 2E, a second photoresist layer B12 with a second photoresist pattern is formed on the first oxide layer 31 and the wet oxide layer 34. Then, according to the second photoresist pattern, the first oxide layer 31 uncovered by the second photoresist layer B12 is etched, so that the second photoresist pattern is transferred to the first oxide layer 31. After the second photoresist layer B12 is removed, a first mask layer A11 is formed (see FIG. 2F). In this embodiment, the first oxide layer 31 is etched as the first mask layer A11 by a wet etching process.

Then, as shown in FIG. 2G, a second oxide layer 32 is formed on the surface of the semiconductor substrate 30, the first mask layer A11 and the wet oxide layer 34. In this embodiment, the thickness of the second oxide layer 32 is about 2000 angstroms. Then, a third photoresist layer B13 with a third photoresist pattern is formed on the second oxide layer 32. According to the third photoresist pattern, the second oxide layer 32 is etched, so that the third photoresist pattern is transferred to the second oxide layer 32. After the third photoresist layer B13 is removed, a second mask layer A12 is formed (see FIG. 2H).

Then, as shown in FIG. 2I, by using the second mask layer A12 as an etch mask, a trench etching process is performed to form a second multi-trench structure C12 in the semiconductor substrate 30. Then, a gate oxide layer 35 is formed on the bottom surface and the sidewall of the second multi-trench structure C12. Since the third photoresist pattern is located at a second side of the semiconductor substrate 30 (e.g. the left side of the profile as shown in FIGS. 2G and 2H), the second multi-trench structure C12 is formed in the second side (i.e. the left side) of the semiconductor substrate 30. The second multi-trench structure C12 comprises a plurality of trenches. For clarification and brevity, the second multi-trench structure C12 with five identical trenches is shown in the drawings. In this embodiment, the depth of the second multi-trench structure C12 is 5000 angstroms.

Then, as shown in FIG. 2J, an in-situ doping polysilicon structure 36 is deposited on the gate oxide layer 35 and the second mask layer A12. The first multi-trench structure C11 is not completely filled with the polysilicon structure 36. Whereas, the space defined by the gate oxide layer 35 within the second multi-trench structure C12 is filled with the polysilicon structure 36, and the second mask layer A12 is covered by the polysilicon structure 36. In this embodiment, the thickness of the polysilicon structure 36 is about 3000 angstroms.

Then, as shown in FIG. 2K, an etch-back process is performed to partially remove the polysilicon structure 36 overlying the gate oxide layer 35 and the second mask layer A12, so that a part of the surface of the second mask layer A12 is exposed. That is, at the right side (i.e. the first side) of the wafer, a part of polysilicon structure 36 is formed on the sidewall of the second mask layer A12 within the first multi-trench structure C11. Whereas, at the left side (i.e. the second side) of the wafer, the polysilicon structure 36 over the second mask layer A12 and the polysilicon structure 36 over the first mask layer A11 and the second mask layer A12 are all removed. Then, a wet dip process is performed to etch the second mask layer A12, so that the second mask layer A12 is thinned (see FIG. 2K). In this step, since a part of the surface of the second mask layer A12 is exposed to the first multi-trench structure C11 by the etch-back process, the part of the second mask layer A12 exposed to the first multi-trench structure C11 is also thinned by the wet dip process.

Then, as shown in FIG. 2L, an ion implantation process is performed to dope the region between the semiconductor substrate 30 and the second multi-trench structure C12 with a dopant. Consequently, a plurality of doped regions 37 are formed in the semiconductor substrate 30. The rightmost doped region 37 is located beside the first mask layer A11. In an embodiment, the dopant is boron ion. Moreover, the ion implantation process is deep doping process.

Then, as shown in FIG. 2M, a dry etching process is performed to remove the exposed second mask layer A12. Consequently, the doped regions 37, the gate oxide layer 35, the first mask layer A11 and the wet oxide layer 34 are exposed. In the step, the exposed second mask layer A12 as shown in FIG. 2I is removed by the dry etching process. Whereas, the polysilicon structure 36 formed at the sidewalls of the first multi-trench structure C11 and the part of the second mask layer A12 formed between the first mask layer A11 and the wet oxide layer 34 are retained. Moreover, the second mask layer A12 formed at the middle bottom surface of the first multi-trench structure C11 is removed. In other words, after the dry etching process is performed, the wet oxide layer 34 under the middle bottom surface of the first multi-trench structure C11 is exposed. Moreover, as shown in FIG. 2M, another ion implantation process (i.e. a shallow doping process) is performed to dope the doped regions 37 (indicated as the shadow) with boron ion (e.g. BF2). Consequently, when the surfaces of the doped regions 37 are in contact with the metal layer in the subsequent process, a low contact resistance is achieved (as ohmic contact to metal).

Then, as shown in FIG. 2N, a metal sputtering process is performed to form a metal sputtering layer 39 on the doped regions 37, the gate oxide layer 35, the polysilicon structure 36 and the first mask layer A11. That is, the metal sputtering layer 39 is simultaneously formed on the polysilicon structure 36 within the first multi-trench structure C11 and formed on the polysilicon structure 36 within the second multi-trench structure C12, and also formed on the exposed surfaces of the second mask layer A12 and the wet oxide layer 34 within the first multi-trench structure C11. In this embodiment, the metal sputtering layer 39 comprises a first metal layer 391 and a second metal layer 392. After the first metal layer 391 is formed on the above structures by the metal sputtering process, a rapid thermal process (RTP) is performed to facilitate the sputtering efficacy. Then, the second metal layer 392 is sputtered on the first metal layer 391. The first metal layer 391 is made of titanium (Ti) or titanium nitride (TiN). The second metal layer 392 is made of aluminum/silicon/copper (Al/Si/Cu) alloy. Therefore, an ohmic contact is generated between the metal sputtering layer 39 and the doped regions 37.

Then, as shown in FIG. 2O, a fourth photoresist layer B14 with a fourth photoresist pattern is formed on the metal sputtering layer 39. Then, the metal sputtering layer 39 uncovered by the fourth photoresist layer B14 is removed by a metal etching process. Consequently, the fourth photoresist pattern is transferred to the metal sputtering layer 39, and a part of the first mask layer A11 is exposed. That is, the region between two trenches of the first multi-trench structure C11 and the right edge of the metal sputtering layer 39 are etched, so that the first mask layer A11 is exposed. After the fourth photoresist layer B14 is removed, the resulting structure is shown in FIG. 2P. Moreover, after the metal sputtering process is done, a sintering process is performed to facilitate adhesion of the metal sputtering layer 39 to the associated structures. Afterwards, a wafer acceptance test (WAT) is performed to test the electrical property of the finished wafer.

The finished rectifier with a vertical MOS structure according to the first embodiment of the present invention is shown in FIG. 2P. The rectifier comprises a semiconductor substrate 30, a first mask layer A11, a wet oxide layer 34, a second mask layer A12, a gate oxide layer 35, a polysilicon structure 36, a plurality of doped regions 37 and a metal sputtering layer 39. A first multi-trench structure C11 and a second multi-trench structure C12 are formed in the right side (i.e. the first side) and the left side (i.e. the second side) of the semiconductor substrate 30, respectively. The first mask layer A11 is formed on the right side of the semiconductor substrate 30 corresponding to the first multi-trench structure C11. The wet oxide layer 34 is formed in the semiconductor substrate 30 corresponding to the periphery of the first multi-trench structure C11. The second mask layer A12 is formed on the sidewalls of the first mask layer A11 and the wet oxide layer 34. The gate oxide layer 35 is formed on the surface of the second multi-trench structure C12. A first part of the polysilicon structure 36 is formed on the sidewall of the second mask layer A12 corresponding to the first multi-trench structure C11. A second part of the polysilicon structure 36 is formed on the gate oxide layer 35 corresponding to the second multi-trench structure C12. The doped regions 37 are formed on the region between the semiconductor substrate 30 and the second multi-trench structure C12, and located beside the first mask layer A11. The metal sputtering layer 39 is formed on the doped regions 37, the gate oxide layer 35 and the second part of the polysilicon structure 36 corresponding to the second multi-trench structure C12, and formed on the first mask layer A11, the second mask layer A12, the first part of the polysilicon structure 36 and the wet oxide layer 34 corresponding to the first multi-trench structure C11. In addition, the first mask layer A11 is partially exposed.

In the rectifier with a vertical MOS structure according to the present invention, the device area or cell area with the ohmic contact is located at the left side (i.e. the second side) of the semiconductor substrate and effectively isolated from the external environment. The guard ring or termination structure with the mask layer is located at the right side (i.e. the first side) of the semiconductor substrate for blocking the current, so that the possibility of causing the leakage current problem is minimized.

It is noted that numerous modifications and alterations of the cell area, the guard ring or the termination structure may be made while retaining the teachings of the invention. Hereinafter, some modifications of the rectifier of the present invention will be illustrated with reference to the second, third and fourth embodiments.

Figure 3A:
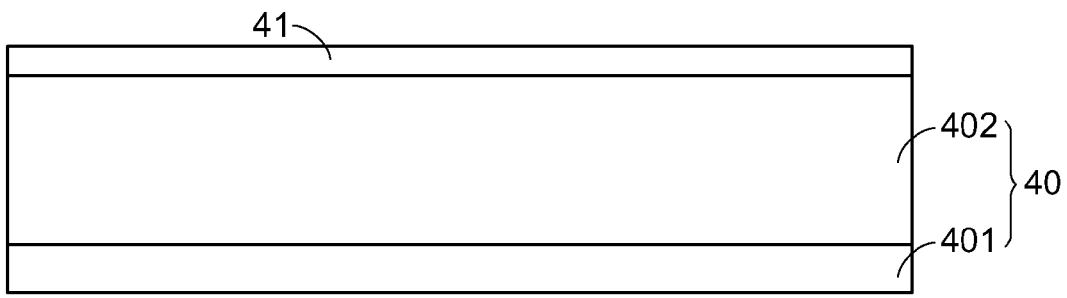
FIGS. 3A~3P schematically illustrate a method of manufacturing a rectifier with a vertical MOS structure according to a second embodiment of the present invention.
Figure 3B:
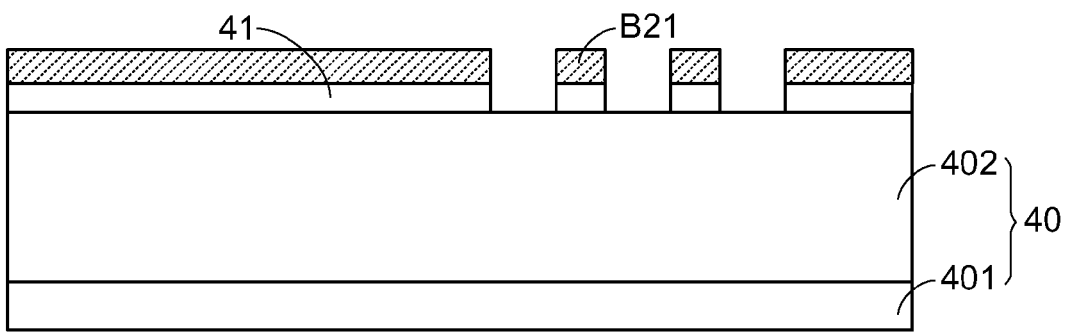
Figure 3C:
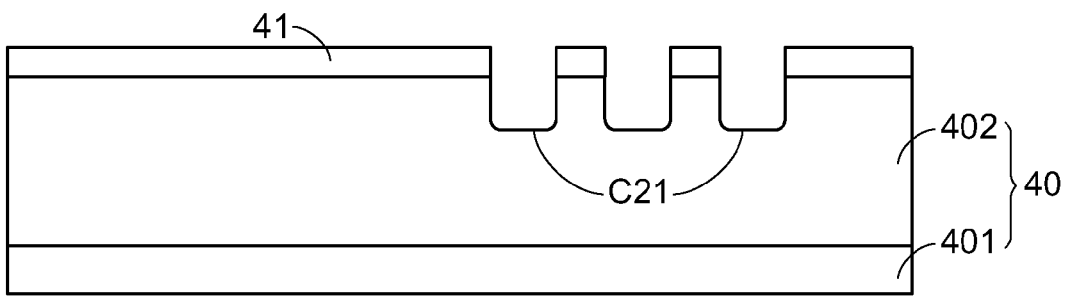
Figure 3D:
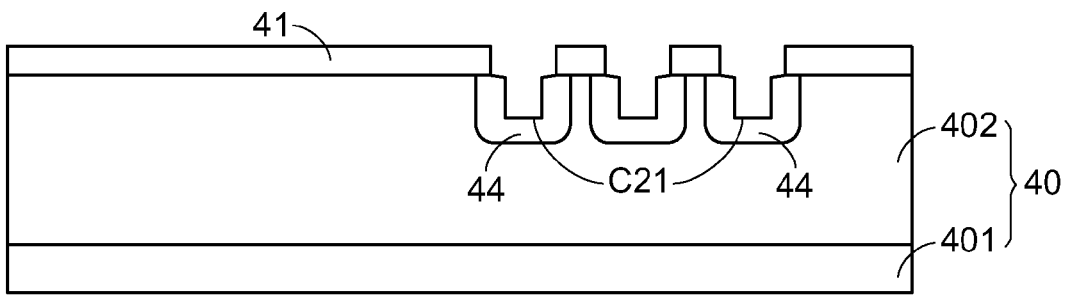
Figure 3E:
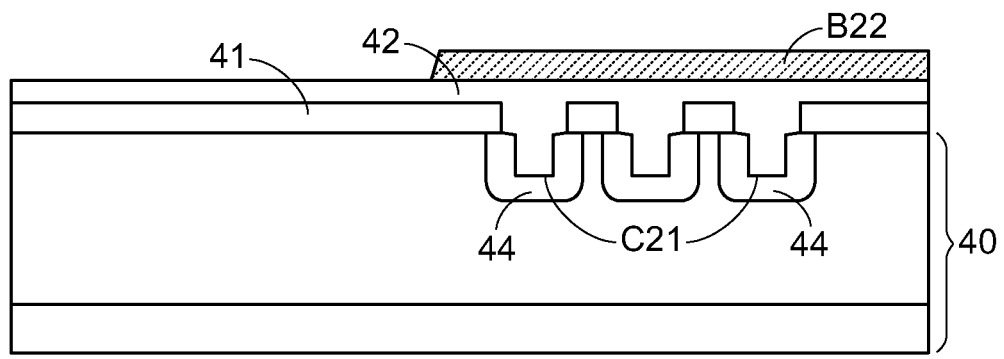
Figure 3F:
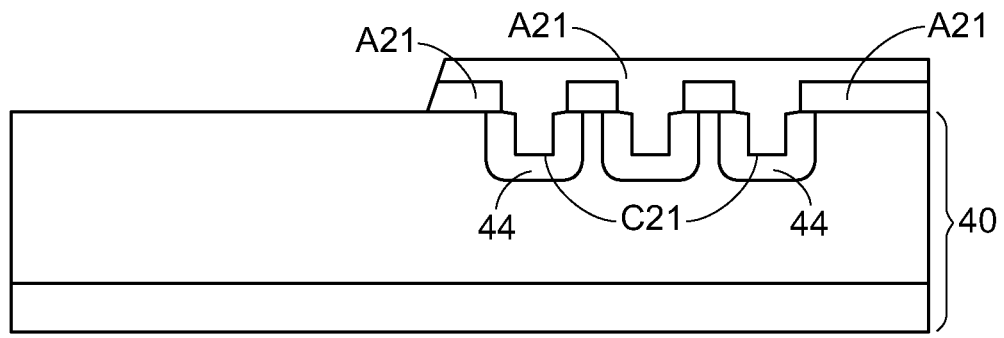
Figure 3G:
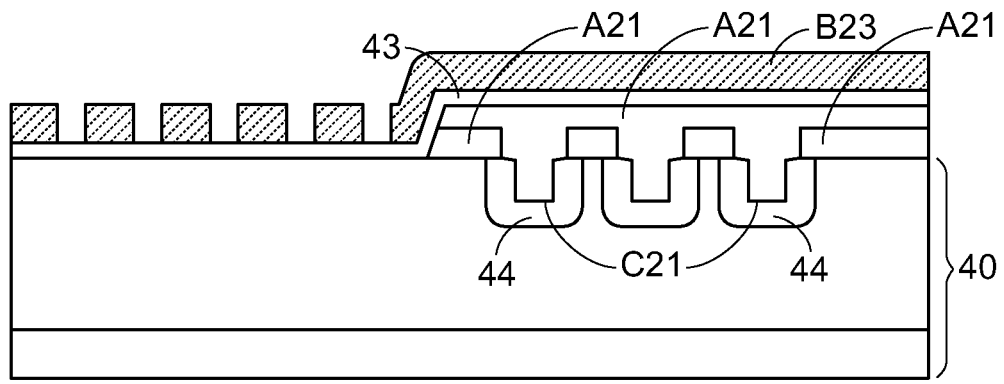
Figure 3H:
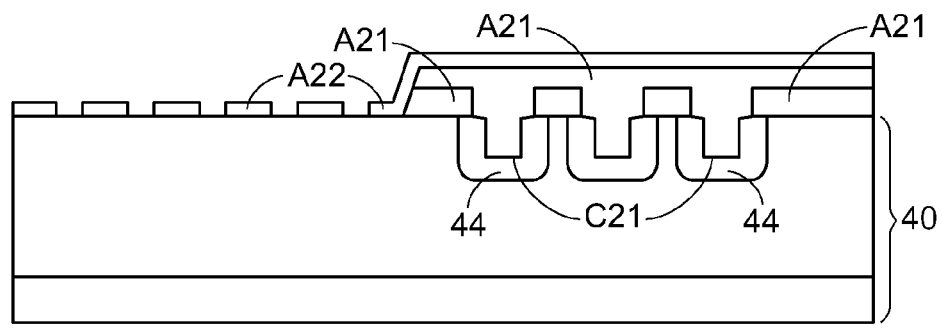
Figure 3I:
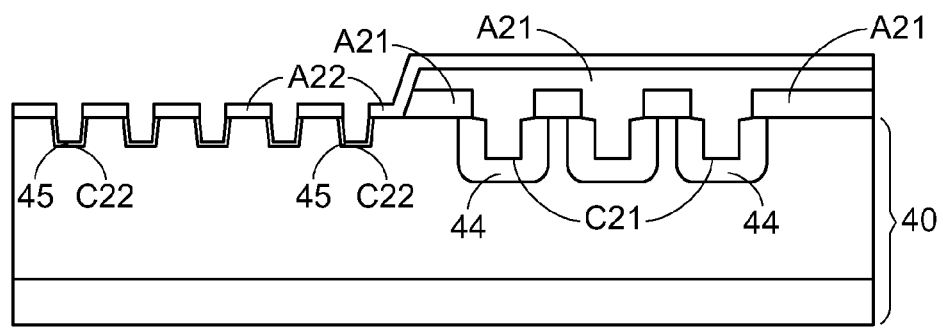
Figure 3J:
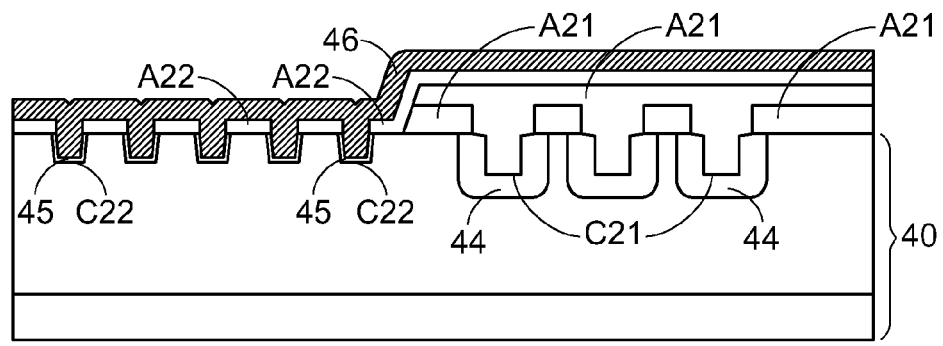
Figure 3K:
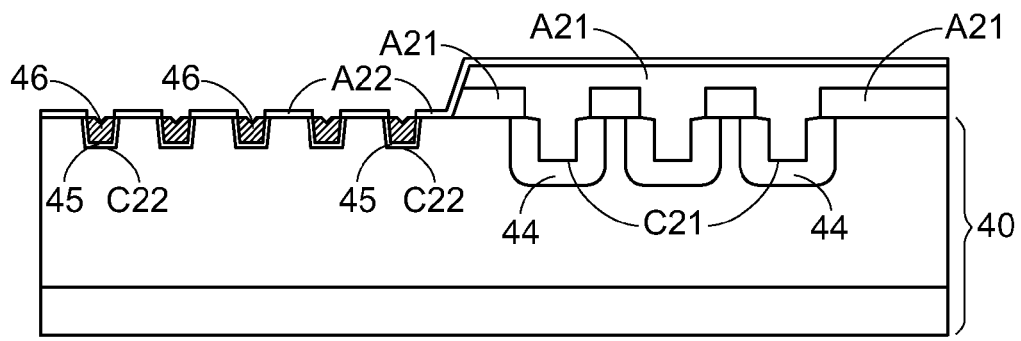
Figure 3L:
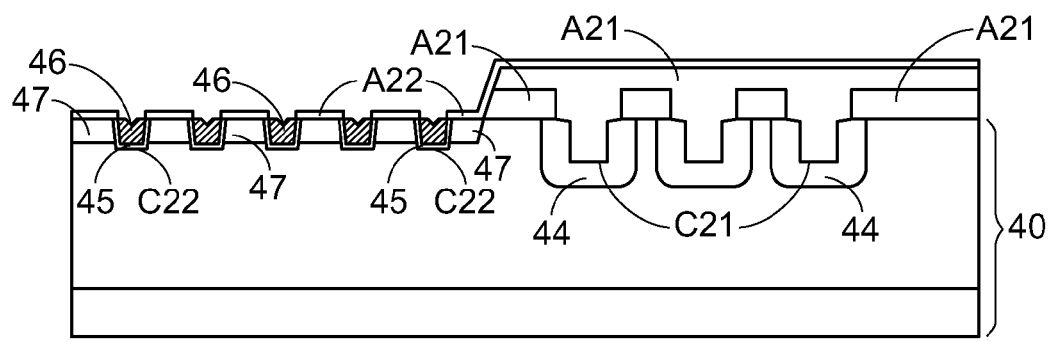
Figure 3M:
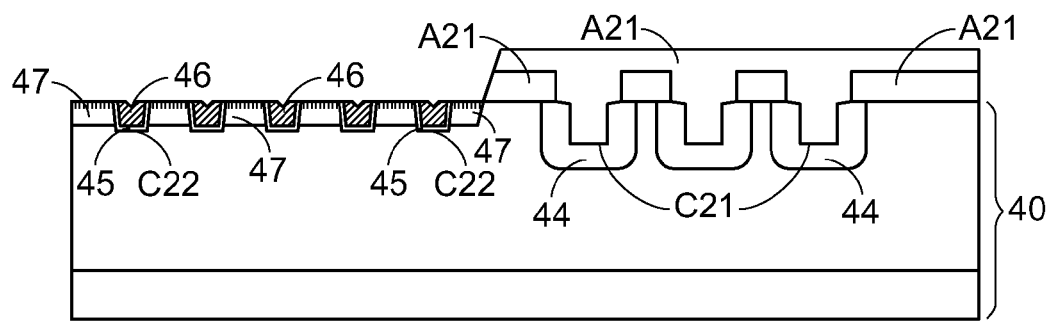
Figure 3N:
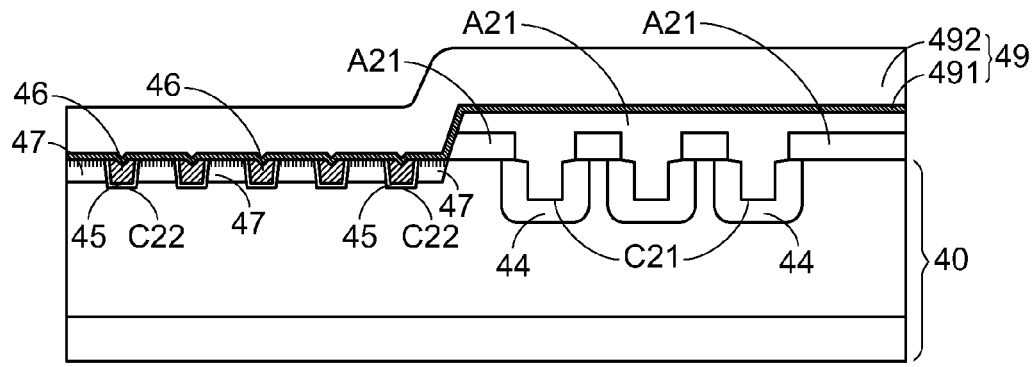
Figure 3O:
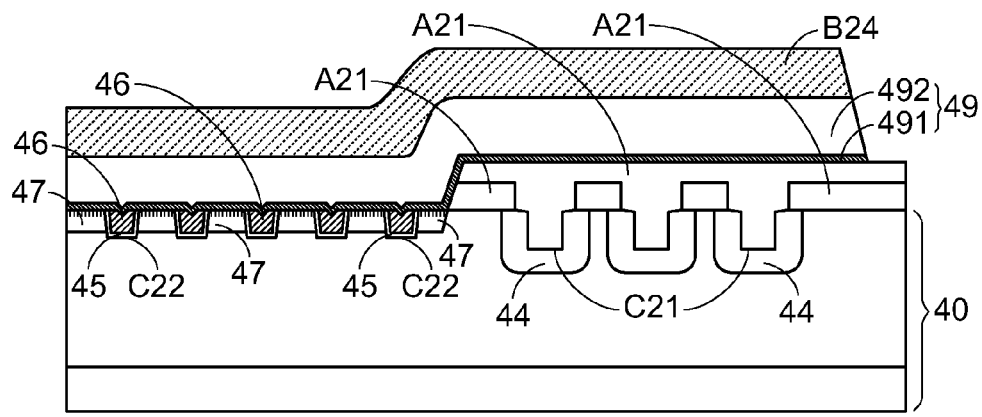
Figure 3P:
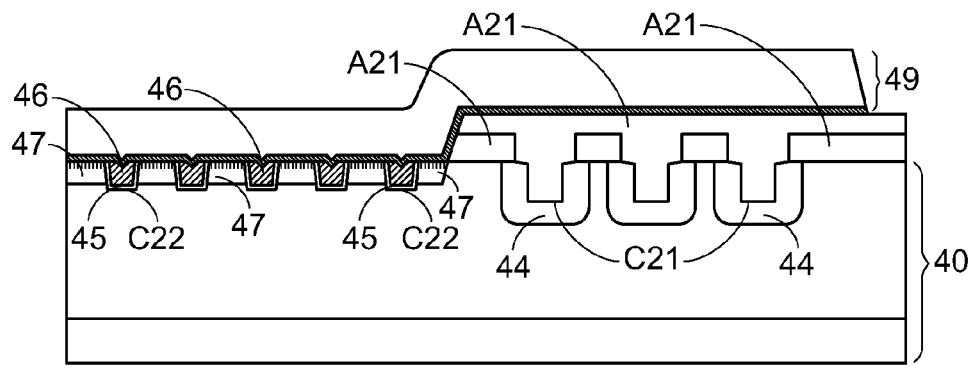

Please refer to FIGS. 3A~3P, which schematically illustrate a method of manufacturing a rectifier with a vertical MOS structure according to a second embodiment of the present invention.

Firstly, as shown in FIG. 3A, a semiconductor substrate 40 is provided. The semiconductor substrate 40 comprises a heavily-doped (N+ type) silicon layer 401 and a lightly-doped (N type) epitaxial layer 402. The lightly-doped epitaxial layer 402 is formed on the heavily-doped silicon layer 401. Moreover, the lightly-doped epitaxial layer 402 has a specified thickness for facilitating defining a plurality of trenches in the subsequent etching process. The steps as shown in FIGS. 3A~3D are similar to the steps as shown in FIGS. 2A~2D.

That is, after the thermal oxidation process is performed to form a first oxide layer 41 is formed on a surface of the semiconductor substrate 40, an annealing process is performed to treat the first oxide layer 41. Then, as shown in FIG. 3B, a first photoresist layer B21 with a first photoresist pattern is formed on the first oxide layer 41. According to the first photoresist layer B21, the first oxide layer 41 is etched to have the first photoresist pattern, so that the first photoresist pattern is transferred to the first oxide layer 41.

After the first photoresist pattern is transferred to the first oxide layer 41, the first photoresist layer B21 is removed. Then, as shown in FIG. 3C, by using the first oxide layer 41 as an etch mask, a trench etching process is performed to form a first multi-trench structure C21 in the semiconductor substrate 40. Since the first photoresist pattern is located at a first side of the semiconductor substrate 40 (e.g. the right side of the wafer as shown in FIGS. 3B and 3C), the first multi-trench structure C21 is formed in the first side (i.e. the right side) of the semiconductor substrate 40. The first multi-trench structure C21 comprises a plurality of trenches. For clarification and brevity, the first multi-trench structure C21 with three identical trenches is shown in the drawings.

Then, as shown in FIG. 3D, a wet oxidation process is performed to form a wet oxide layer 44 on a surface of the first multi-trench structure C21 and in the semiconductor substrate 40. That is, a part of the wet oxide layer 44 is formed on the surface of the first multi-trench structure C21, and the other part the wet oxide layer 44 is formed in the semiconductor substrate 40. Due to the wet oxide layer 44, the space defined by the first multi-trench structure C21 is shrunk. In this embodiment, the thickness of the wet oxide layer 44 is about 4000 angstroms.

Then, as shown in FIG. 3E, a second oxide layer 42 is formed on the first oxide layer 41 and the wet oxide layer 44 by a chemical vapor deposition (CVD) process. That is, the space defined by the wet oxide layer 44 corresponding to the first multi-trench structure C21 is filled with the second oxide layer 42 and the first oxide layer 41 is completely covered by the second oxide layer 42. In this embodiment, the thickness of the second oxide layer 42 is about 4000 angstroms. After the second oxide layer 42 is formed on the first oxide layer 41 and the wet oxide layer 44, a second photoresist layer B22 with a second photoresist pattern is formed on the second oxide layer 42. Then, according to the second photoresist pattern, the first oxide layer 41 and the second oxide layer 42 uncovered by the second photoresist layer B22 are etched, so that the second photoresist pattern is transferred. After the second photoresist layer B22 is removed, a first mask layer A21 is formed (see FIG. 3F). In this embodiment, the first oxide layer 41 and the second oxide layer 42 are collectively etched as the first mask layer A21 by a wet etching process.

Then, as shown in FIG. 3G, a third oxide layer 43 is formed on the surface of the semiconductor substrate 40 and the first mask layer A21. In this embodiment, the thickness of the third oxide layer 43 is about 2000 angstroms. Then, a third photoresist layer B23 with a third photoresist pattern is formed on the third oxide layer 43. According to the third photoresist pattern, the third oxide layer 43 is etched, so that the third photoresist pattern is transferred. After the third photoresist layer B23 is removed, a second mask layer A22 is formed (see FIG. 3H). In this embodiment, the third oxide layer 43 is etched as the second mask layer A22 by a dry etching process.

Then, as shown in FIG. 3I, by using the second mask layer A22 as an etch mask, a trench etching process is performed to form a second multi-trench structure C22 in the semiconductor substrate 40. Then, a gate oxide layer 45 is formed on the bottom surface and the sidewall of the second multi-trench structure C22. Since the third photoresist pattern is located at a second side of the semiconductor substrate 40 (e.g. the left side of the wafer as shown in FIGS. 3G and 3H), the second multi-trench structure C22 is formed in the second side (i.e. the left side) of the semiconductor substrate 40. The configurations and the subsequent processes of the second multi-trench structure C22 in the second side of the semiconductor substrate 40 are similar to those of the first embodiment.

Then, as shown in FIG. 3J, a chemical vapor deposition process is performed to form a polysilicon structure 46 on the gate oxide layer 45 and the second mask layer A22. Consequently, the space defined by the gate oxide layer 45 within the second multi-trench structure C22 is filled with the polysilicon structure 46, and the second mask layer A22 at the first side and the second side of the wafer is covered by the polysilicon structure 46.

Then, as shown in FIG. 3K, an etch-back process is performed to partially remove the polysilicon structure 46, so that the second mask layer A22 is exposed. That is, at the left side (i.e. the second side) and the right side (i.e. the first side) of the wafer, the polysilicon structure 46 overlying the second mask layer A22 is removed. Then, a wet dip process is performed to etch the second mask layer A22, so that the second mask layer A22 is thinned (see FIG. 3K).

Then, as shown in FIG. 3L, an ion implantation process is performed to dope the region between the semiconductor substrate 40 and the second multi-trench structure C22 with a dopant. Consequently, a plurality of doped regions 47 are formed in the semiconductor substrate 40. The rightmost doped region 47 is located beside the first mask layer A21. Like the first embodiment, the dopant is boron ion, and the ion implantation process is deep doping process.

Then, as shown in FIG. 3M, a dry etching process is performed to remove the exposed second mask layer A22. Consequently, the doped regions 47, the gate oxide layer 45 and the first mask layer A21 are exposed. In the step, the exposed second mask layer A22 as shown in FIG. 3I is removed by the dry etching process. Moreover, as shown in FIG. 3M, another ion implantation process (i.e. a shallow doping process) is performed to dope the doped regions 47 with boron ion (e.g. BF2).

Then, as shown in FIG. 3N, a metal sputtering process is performed to form a metal sputtering layer 49 on the doped regions 47, the gate oxide layer 45, the polysilicon structure 46 and the first mask layer A21. In this embodiment, the metal sputtering layer 49 comprises a first metal layer 491 and a second metal layer 492. After the first metal layer 491 is formed, a rapid thermal process (RTP) is performed to facilitate the sputtering efficacy. Then, the second metal layer 492 is sputtered on the first metal layer 491. The first metal layer 491 is made of titanium (Ti) or titanium nitride (TiN). The second metal layer 492 is made of aluminum/silicon/copper (Al/Si/Cu) alloy. Therefore, an ohmic contact is generated between the metal sputtering layer 49 and the doped regions 47.

Then, as shown in FIG. 3O, a fourth photoresist layer B24 with a fourth photoresist pattern is formed on the metal sputtering layer 49. Then, the metal sputtering layer 49 uncovered by the fourth photoresist layer B24 is removed by a metal etching process. Consequently, the fourth photoresist pattern is transferred to the metal sputtering layer 49, and a part of the first mask layer A21 is exposed. That is, the metal sputtering layer 49 at the right edge of the semiconductor substrate 40 is etched, so that the first mask layer A21 is exposed.

After the fourth photoresist layer B24 is removed, the resulting structure is shown in FIG. 3P. Moreover, after the metal sputtering process is done, a sintering process is performed to facilitate adhesion of the metal sputtering layer 49 to the associated structures. Afterwards, a wafer acceptance test (WAT) is performed to test the electrical property of the finished wafer.

The finished rectifier with a vertical MOS structure according to the second embodiment of the present invention is shown in FIG. 3P. The rectifier comprises a semiconductor substrate 40, a first mask layer A21, a wet oxide layer 44, a gate oxide layer 45, a polysilicon structure 46, a plurality of doped regions 47 and a metal sputtering layer 49. A first multi-trench structure C21 and a second multi-trench structure C22 are formed in the right side (i.e. the first side) and the left side (i.e. the second side) of the semiconductor substrate 40, respectively. The first mask layer A21 is formed on the right side of the semiconductor substrate 40 corresponding to the first multi-trench structure C21 and on the wet oxide layer 44. The wet oxide layer 44 is formed on a surface of the first multi-trench structure C21 and in the semiconductor substrate 40. The gate oxide layer 45 is formed on the surface of the second multi-trench structure C22. The polysilicon structure 46 is formed on the gate oxide layer 45 within the second multi-trench structure C22. The doped regions 47 are formed on the region between the semiconductor substrate 40 and the second multi-trench structure C22, and located beside the first mask layer A21. The metal sputtering layer 49 is formed on the doped regions 47, the gate oxide layer 45 and the polysilicon structure 46 corresponding to the second multi-trench structure C22, and formed on the first mask layer A21 corresponding to the first multi-trench structure C21. In addition, the first mask layer A21 is partially exposed.

Please refer to FIGS. 4A~4K, which schematically illustrate a method of manufacturing a rectifier with a vertical MOS structure according to a third embodiment of the present invention. Firstly, the steps as shown in FIGS. 3A~3H are performed. That is, a semiconductor substrate 50 including a heavily-doped (N+ type) silicon layer 501 and a lightly-doped (N type) epitaxial layer 502 is provided. In addition, a first multi-trench structure C31, a wet oxide layer 54 and a first mask layer A31 are formed at the right side (i.e. the first side) of the semiconductor substrate 50, and a second mask layer A32 is formed at the left side (i.e. the second side) of the semiconductor substrate 50.

Figure 4A:
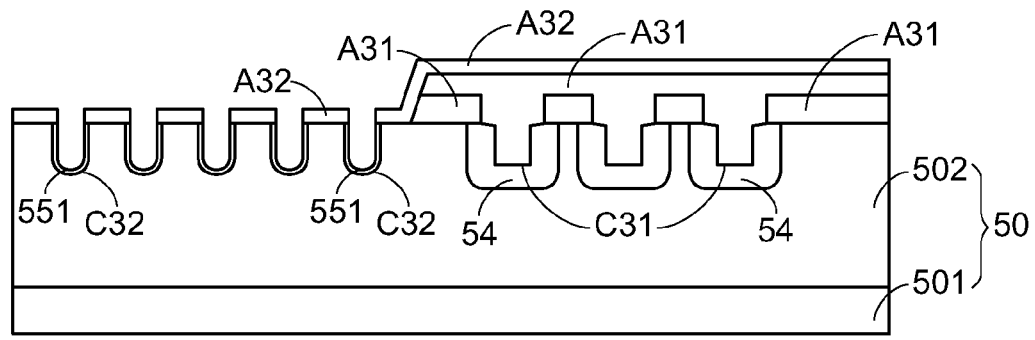
FIGS. 4A~4K schematically illustrate a method of manufacturing a rectifier with a vertical MOS structure according to a third embodiment of the present invention.

After the resulting structure as shown in FIG. 3H is produced, by using the second mask layer A32 as an etch mask, a trench etching process is performed to form a second multi-trench structure C32 in the semiconductor substrate 50 (see FIG. 4A). Then, a trench rounding process is performed to remove the rough edges on the bottom surface and the sidewall of the second multi-trench structure C32 so as to provide a better condition for the formation of associated oxide layers in the subsequent processes. Then, as shown in FIG. 4A, a first gate oxide layer 551 is formed on the bottom surface and the sidewall of the second multi-trench structure C32. Like the first and second embodiments, the second multi-trench structure C32 is also formed in the second side (i.e. the left side) of the semiconductor substrate 50.

Figure 4B:
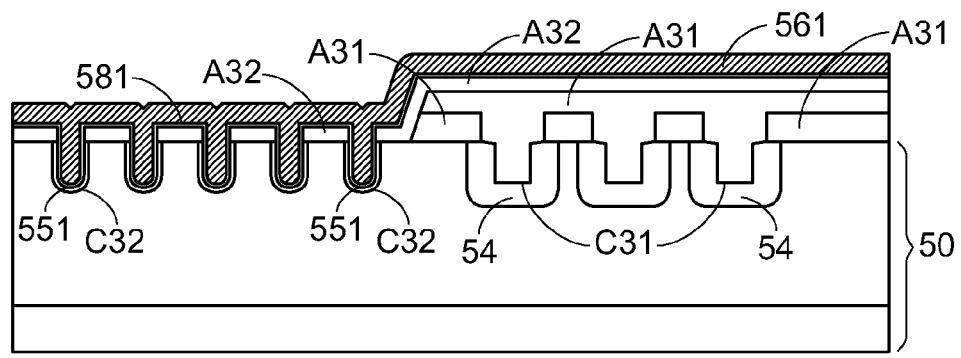

Then, as shown in FIG. 4B, a chemical vapor deposition process is performed to form a gate dielectric layer 581 on the first gate oxide layer 551 and the second mask layer A32. Then, another chemical vapor deposition process is performed to form a first polysilicon structure 561 on the gate dielectric layer 581. Consequently, the space defined by the gate dielectric layer 581 within the second multi-trench structure C32 is filled with the first polysilicon structure 561, and the gate dielectric layer 581 on the second mask layer A32 at the first side and the second side of the wafer is covered by the first polysilicon structure 561. In this embodiment, the gate dielectric layer 581 is a silicon nitride (SiN) film with a thickness of about 300 angstroms. The film-type gate dielectric layer 581 deposited on the first gate oxide layer 551 is effective to reduce the leakage current and hinder the boron ion diffusion. In this embodiment, the thickness of the first polysilicon structure 561 is about 4000 angstroms.

Figure 4C:
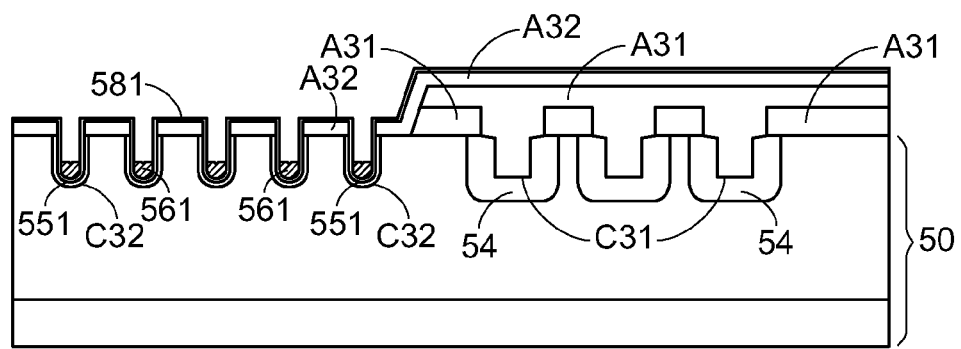

Then, as shown in FIG. 4C, an etch-back process is performed to partially remove the first polysilicon structure 561, so that the gate dielectric layer 581 is exposed and a part of first polysilicon structure 561 within the second multi-trench structure C32 is retained.

Figure 4D:
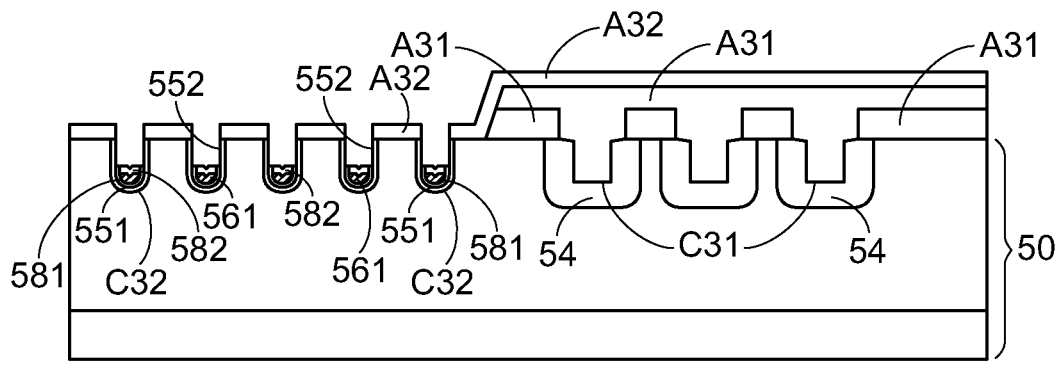

Then, as shown in FIG. 4D, a polysilicon oxide layer 582 is formed on the first polysilicon structure 561 within the second multi-trench structure C32. Then, a wet etching process is performed to remove the exposed gate dielectric layer 581. After the polysilicon oxide layer 582 is formed, a wet etching process is performed to etch the exposed first gate oxide layer 551, so that a second gate oxide layer 552 is formed where the first gate oxide layer 551 is etched. In other words, the second gate oxide layer 552 is exposed, and the first gate oxide layer 551 which is not etched is located under the second gate oxide layer 552.

Figure 4E:
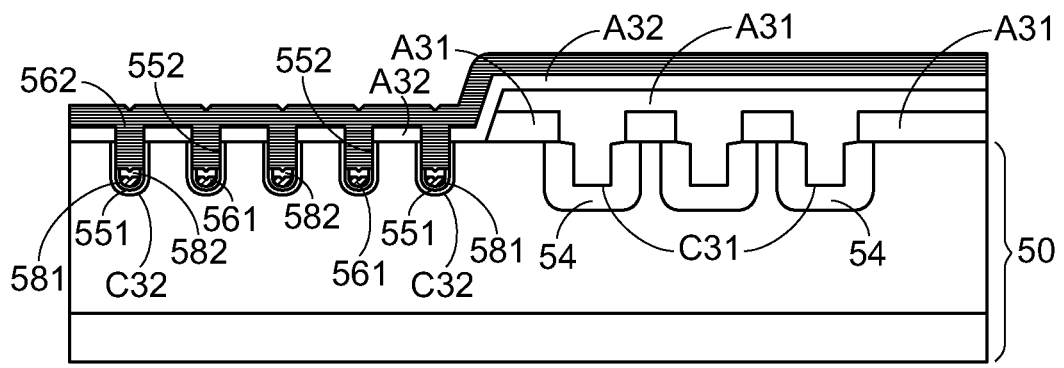

Then, as shown in FIG. 4E, a chemical vapor deposition process is performed to form a second polysilicon structure 562 on the second mask layer A32 and on the gate dielectric layer 581 and the polysilicon oxide layer 582 within the second multi-trench structure C32. Consequently, the space defined by the polysilicon oxide layer 582 within the second multi-trench structure C32 is filled with the second polysilicon structure 562, and the second mask layer A32 at the first side and the second side of the wafer is covered by the second polysilicon structure 562. In this embodiment, the thickness of the second polysilicon structure 562 is about 4000 angstroms.

Figure 4F:
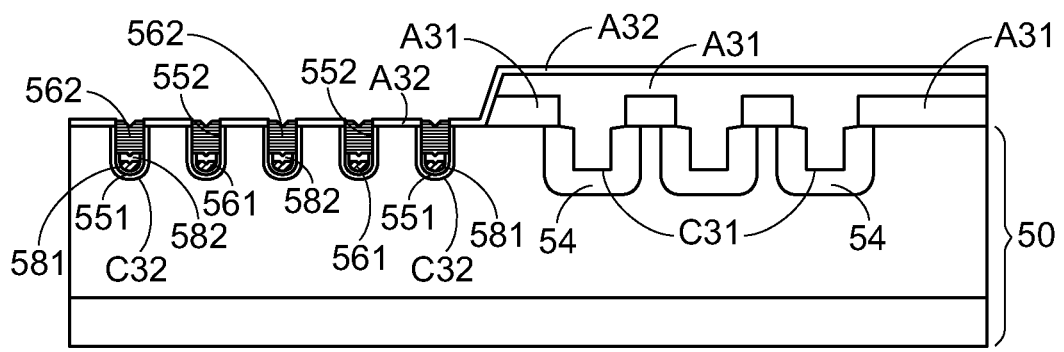

Then, as shown in FIG. 4F, an etch-back process is performed to partially remove the second polysilicon structure 562, so that the second mask layer A32 is exposed. Then, another etch-back process is performed to etch the second mask layer A32, so that the second mask layer A32 is thinned (see FIG. 4F).

Figure 4G:
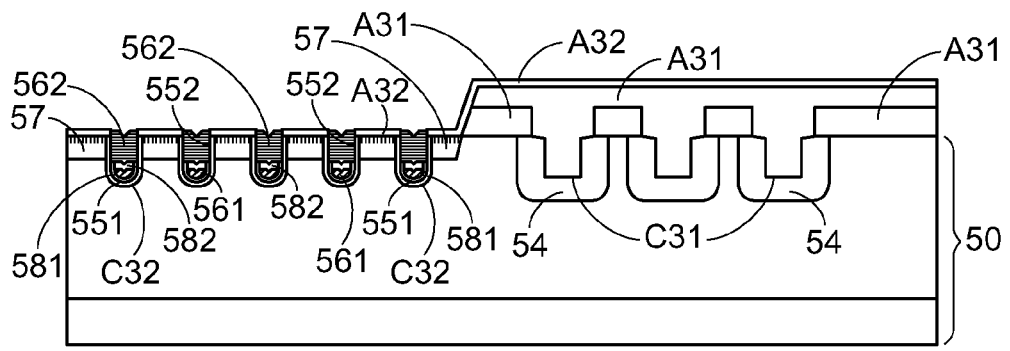

Then, as shown in FIG. 4G, an ion implantation process is performed to dope the region between the semiconductor substrate 50 and the second multi-trench structure C32 with a dopant. Consequently, a plurality of doped regions 57 are formed in the semiconductor substrate 50. The rightmost doped region 57 is located beside the first mask layer A31. An example of the dopant is boron ion. Like the above embodiments, the ion implantation process is deep doping process, and a shallow doping process is performed after the deep doping process is performed.

Figure 4H:
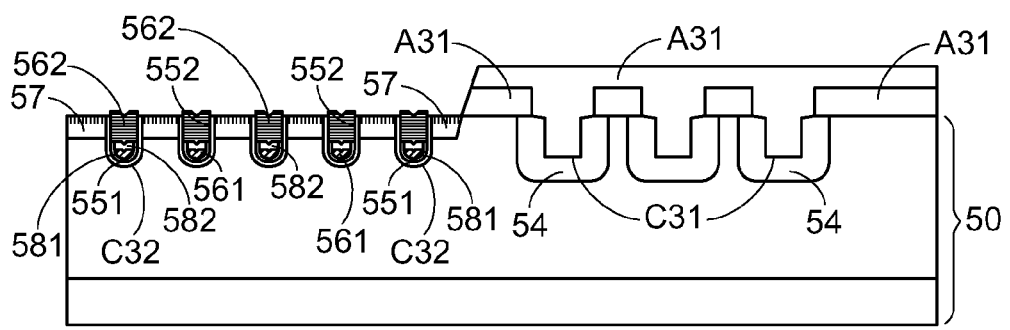

Then, as shown in FIG. 4H, the exposed second mask layer A32 is removed. Consequently, the doped regions 57, the second gate oxide layer 552 and the first mask layer A31 are exposed.

Figure 4I:
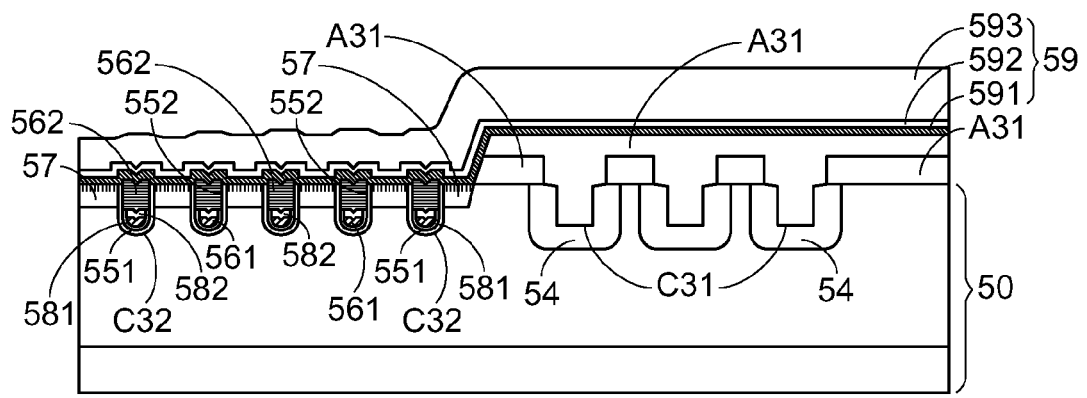

Then, as shown in FIG. 4I, a metal sputtering process is performed to form a metal sputtering layer 59 on the doped regions 57, the second gate oxide layer 552, the second polysilicon structure 562 and the first mask layer A31. In this embodiment, the metal sputtering layer 59 comprises a first metal layer 591, a second metal layer 592 and a third metal layer 593. After the first metal layer 591 is formed, a rapid thermal process (RTP) is performed to facilitate the sputtering efficacy. Then, the second metal layer 592 is sputtered on the first metal layer 591. Then, the third metal layer 593 is formed on the second metal layer 592. In an embodiment, the first metal layer 591 is made of titanium (Ti), the second metal layer 592 is made of titanium nitride (TiN), and the third metal layer 593 is made of aluminum/silicon/copper (Al/Si/Cu) alloy. Therefore, an ohmic contact is generated between the metal sputtering layer 59 and the doped regions 57.

Figure 4J:
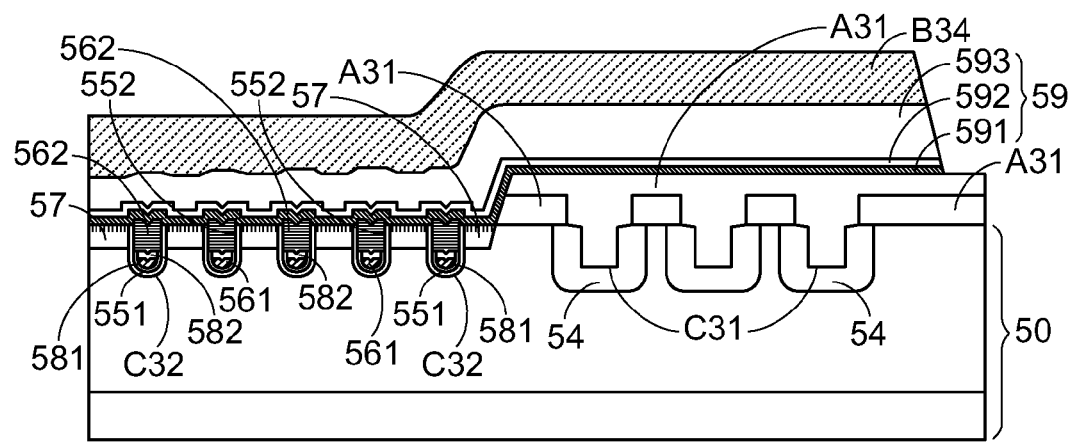

Then, as shown in FIG. 4J, a fourth photoresist layer B34 with a fourth photoresist pattern is formed on the metal sputtering layer 59. Then, the metal sputtering layer 59 uncovered by the fourth photoresist layer B34 is removed by a metal etching process. Consequently, the fourth photoresist pattern is transferred to the metal sputtering layer 59, and a part of the first mask layer A31 is exposed. That is, the metal sputtering layer 59 at the right edge of the semiconductor substrate 50 is etched, so that the first mask layer A31 is exposed.

Figure 4K:
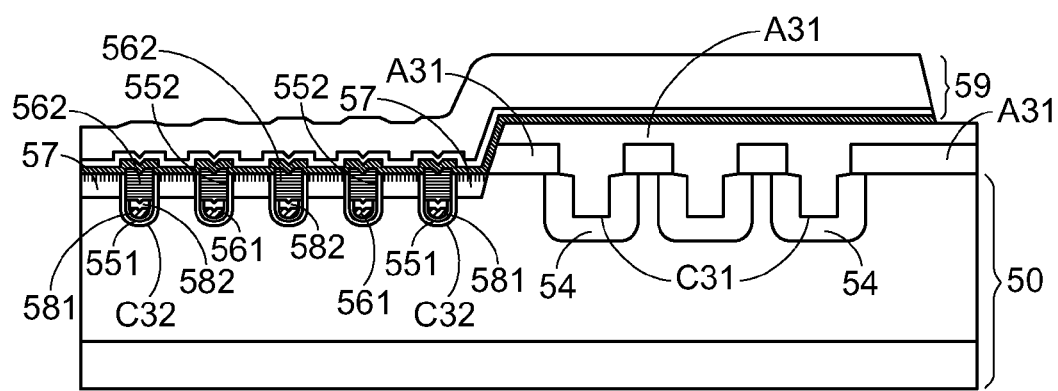

After the fourth photoresist layer B34 is removed, the resulting structure is shown in FIG. 4K. Moreover, after the metal sputtering process is done, a sintering process is performed to facilitate adhesion of the metal sputtering layer 59 to the associated structures. Afterwards, a wafer acceptance test (WAT) is performed to test the electrical property of the finished wafer.

The finished rectifier with a vertical MOS structure according to the third embodiment of the present invention is shown in FIG. 4K. The rectifier comprises a semiconductor substrate 50, a first mask layer A31, a wet oxide layer 54, a gate oxide layer (including a first gate oxide layer 551 and a second gate oxide layer 552), a first polysilicon structure 561, a second polysilicon structure 562, a plurality of doped regions 57, a gate dielectric layer 581, a polysilicon oxide layer 582 and a metal sputtering layer 59. A first multi-trench structure C31 and a second multi-trench structure C32 are formed in the right side (i.e. the first side) and the left side (i.e. the second side) of the semiconductor substrate 50, respectively. The first mask layer A31 is formed on the right side of the semiconductor substrate 50 corresponding to the first multi-trench structure C31 and on the wet oxide layer 54. The wet oxide layer 54 is formed on a surface of the first multi-trench structure C31 and in the semiconductor substrate 50. The gate oxide layer (including a first gate oxide layer 551 and a second gate oxide layer 552) is formed on the surface of the second multi-trench structure C32. The gate dielectric layer 581 is formed on a part of the surface of the gate oxide layer. The first polysilicon structure 561 is formed on the gate dielectric layer 581. The polysilicon oxide layer 582 is formed on the first polysilicon structure 561. The second polysilicon structure 562 is formed on the gate dielectric layer 581 and the polysilicon oxide layer 582. The doped regions 57 are formed on the region between the semiconductor substrate 50 and the second multi-trench structure C32, and located beside the first mask layer A31. The metal sputtering layer 59 is formed on the doped regions 57, the second gate oxide layer 552 and the second polysilicon structure 562 corresponding to the second multi-trench structure C32, and formed on the first mask layer A31 corresponding to the first multi-trench structure C31. In addition, the first mask layer A31 is partially exposed.

Please refer to FIGS. 5A~5K, which schematically illustrate a method of manufacturing a rectifier with a vertical MOS structure according to a fourth embodiment of the present invention. Firstly, the steps as shown in FIGS. 2A~2H are performed. That is, a semiconductor substrate 60 including a heavily-doped (N+ type) silicon layer 601 and a lightly-doped (N type) epitaxial layer 602 is provided. In addition, a first multi-trench structure C41, a wet oxide layer 64 and a first mask layer A41 are formed at the right side (i.e. the first side) of the semiconductor substrate 60, and a second mask layer A42 is formed at the left side (i.e. the second side) of the semiconductor substrate 60.

Figure 5A:
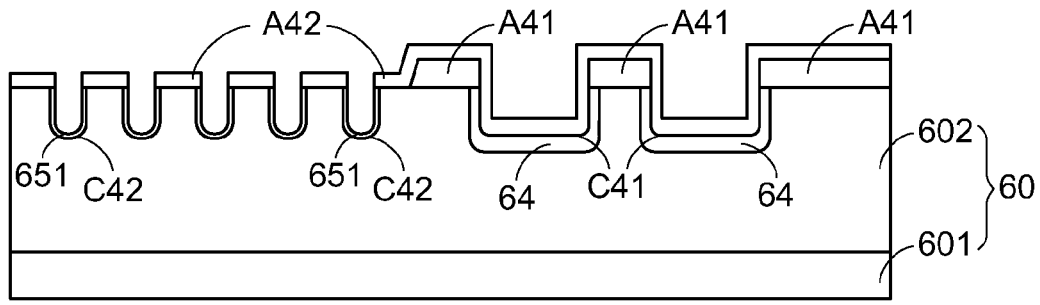
FIGS. 5A~5K schematically illustrate a method of manufacturing a rectifier with a vertical MOS structure according to a fourth embodiment of the present invention.

After the resulting structure as shown in FIG. 2H is produced, by using the second mask layer A42 as an etch mask, a trench etching process is performed to form a second multi-trench structure C42 in the semiconductor substrate 60 (see FIG. 5A). Then, a trench rounding process is performed to remove the rough edges on the bottom surface and the sidewall of the second multi-trench structure C42 so as to provide a better condition for the formation of associated oxide layers in the subsequent processes. The subsequent processes of forming the associated structures corresponding to the second multi-trench structure C42 at the left side (i.e. the second side) of the semiconductor substrate 60 are similar to those of the third embodiment. As shown in FIG. 5A, a first gate oxide layer 651 is formed on the bottom surface and the sidewall of the second multi-trench structure C42.

Figure 5B:
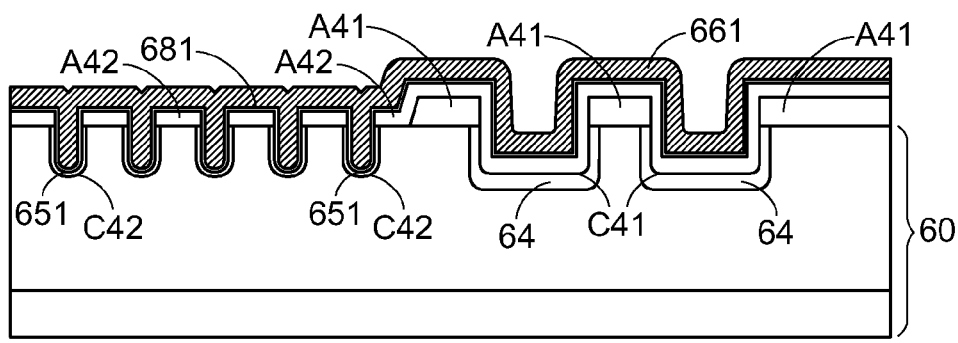

Then, as shown in FIG. 5B, a chemical vapor deposition process is performed to form a gate dielectric layer 681 on the first gate oxide layer 651 and the second mask layer A42. Then, an in-situ doping process is performed to form a first polysilicon structure 661 on the gate dielectric layer 681. The first multi-trench structure C41 is not completely filled with the first polysilicon structure 661. Whereas, the space defined by the first gate oxide layer 651 and the gate dielectric layer 681 within the second multi-trench structure C42 is filled with the first polysilicon structure 661, and the second mask layer A42 is covered by the first polysilicon structure 661.

Figure 5C:
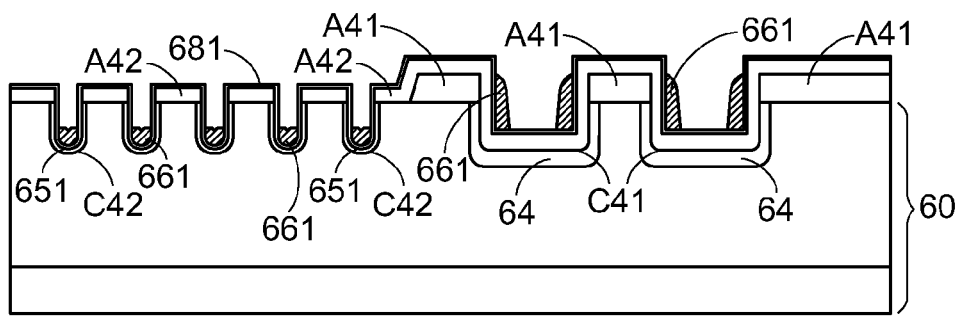

Then, as shown in FIG. 5C, an etch-back process is performed to partially remove the first polysilicon structure 661. Consequently, the gate dielectric layer 681 is exposed, and a part of first polysilicon structure 661 within the first multi-trench structure C41 and the second multi-trench structure C42 is retained.

Figure 5D:
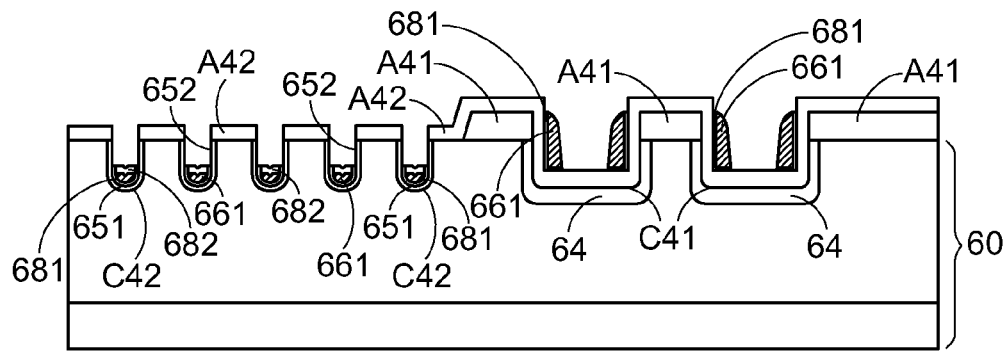

Then, as shown in FIG. 5D, a polysilicon oxide layer 682 is formed on the first polysilicon structure 661 within the second multi-trench structure C42. Then, a wet etching process is performed to remove the exposed gate dielectric layer 681. After the polysilicon oxide layer 582 is formed, a wet etching process is performed to etch the exposed first gate oxide layer 651, so that a second gate oxide layer 652 is formed where the first gate oxide layer 651 is etched. In other words, the second gate oxide layer 652 is exposed, and the first gate oxide layer 651 which is not etched is located under the second gate oxide layer 652.

Figure 5E:
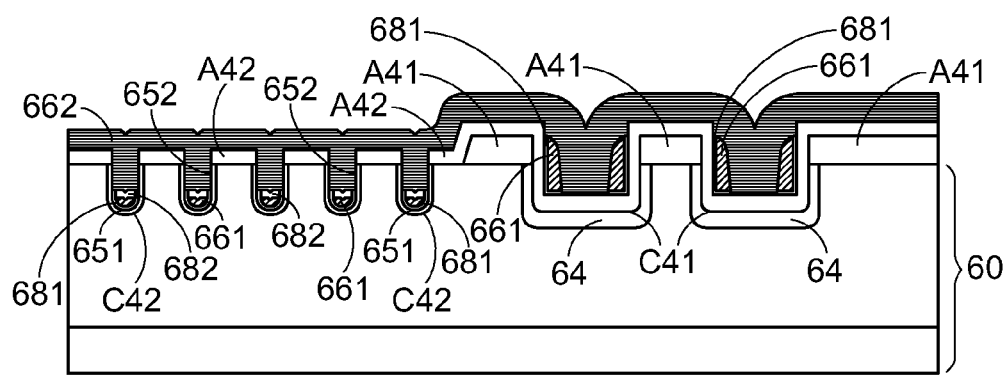

Then, as shown in FIG. 5E, an in-situ doping process is performed to form a second polysilicon structure 662 on the second mask layer A42 and on the gate dielectric layer 681 and the polysilicon oxide layer 682 within the second multi-trench structure C42. Consequently, the space defined by the polysilicon oxide layer 682 within the second multi-trench structure C42 is filled with the second polysilicon structure 662. Whereas, the space between the first multi-trench structure C41 and the second mask layer A42 is completely filled with the second polysilicon structure 662. In this embodiment, the first polysilicon structure 661 and the second polysilicon structure 662 are made of the same material.

Figure 5F:
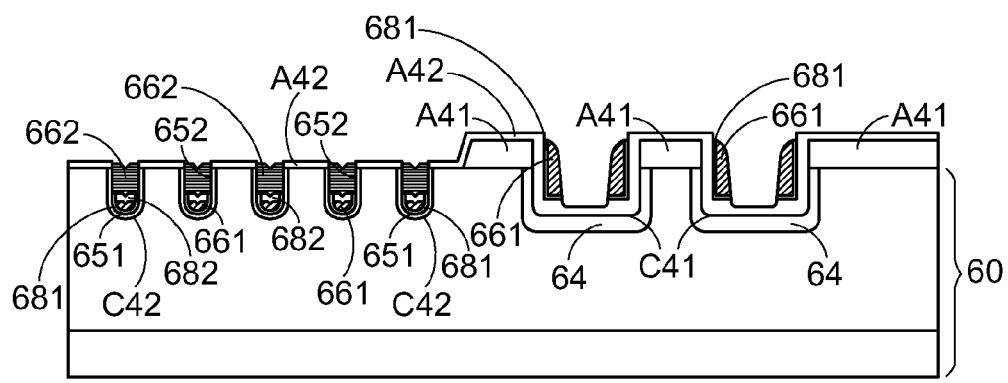

Then, as shown in FIG. 5F, an etch-back process is performed to partially remove the second polysilicon structure 662, so that the second mask layer A42 is exposed. Meanwhile, corresponding to the first multi-trench structure C41, the second polysilicon structure 662 is removed, but the first polysilicon structure 661 is retained. Then, an etch-back process is performed to etch the second mask layer A42, so that the second mask layer A42 is thinned (see FIG. 5F).

Figure 5G:
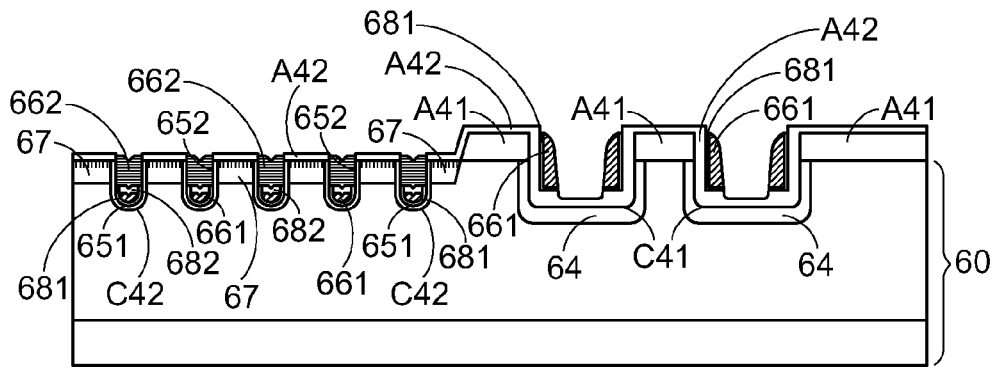

Then, as shown in FIG. 5G, an ion implantation process is performed to dope the region between the semiconductor substrate 60 and the second multi-trench structure C42 with a dopant. Consequently, a plurality of doped regions 67 are formed in the semiconductor substrate 60. The rightmost doped region 67 is located beside the first mask layer A41. An example of the dopant is boron ion. Like the above embodiments, the ion implantation process is deep doping process, and a shallow doping process is performed after the deep doping process is performed.

Figure 5H:
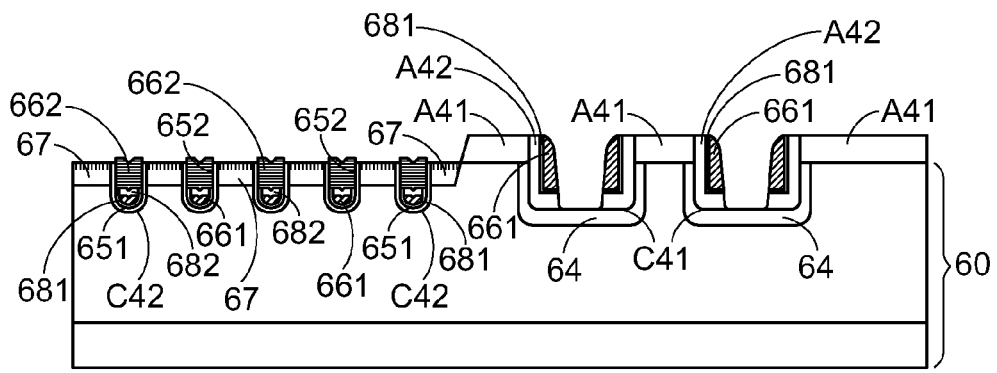

Then, as shown in FIG. 5H, the exposed second mask layer A42 is removed. Consequently, the gate dielectric layer 681 formed at the sidewalls of the first multi-trench structure C41 and the part of the second mask layer A42 formed between the first mask layer A41 and the wet oxide layer 64 are retained. Whereas, the doped regions 67 and the second gate oxide layer 652 at the second side and the first mask layer A41 at the first side are exposed.

Figure 5I:
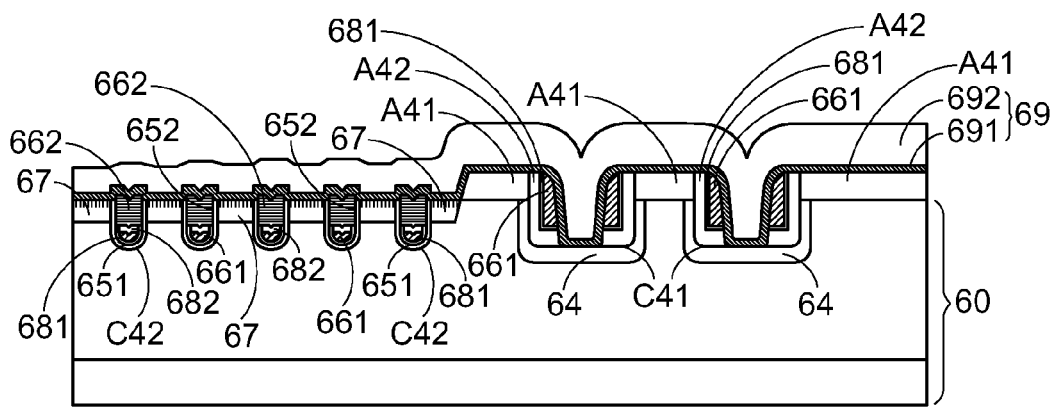

Then, as shown in FIG. 5I, a metal sputtering process is performed to form a metal sputtering layer 69 on the doped regions 67, the second gate oxide layer 652, the second polysilicon structure 662, the first mask layer A41 and the exposed parts of the second mask layer A42, the gate dielectric layer 681 and the first polysilicon structure 661 corresponding to the first multi-trench structure C41. In this embodiment, the metal sputtering layer 69 comprises a first metal layer 691 and a second metal layer 692. After the first metal layer 691 is formed on the above structures by the metal sputtering process, a rapid thermal process (RTP) is performed to facilitate the sputtering efficacy. Then, the second metal layer 692 is sputtered on the first metal layer 691. The first metal layer 691 is made of titanium (Ti) or titanium nitride (TiN). The second metal layer 692 is made of aluminum/silicon/copper (Al/Si/Cu) alloy. Therefore, an ohmic contact is generated between the metal sputtering layer 69 and the doped regions 67.

Figure 5J:
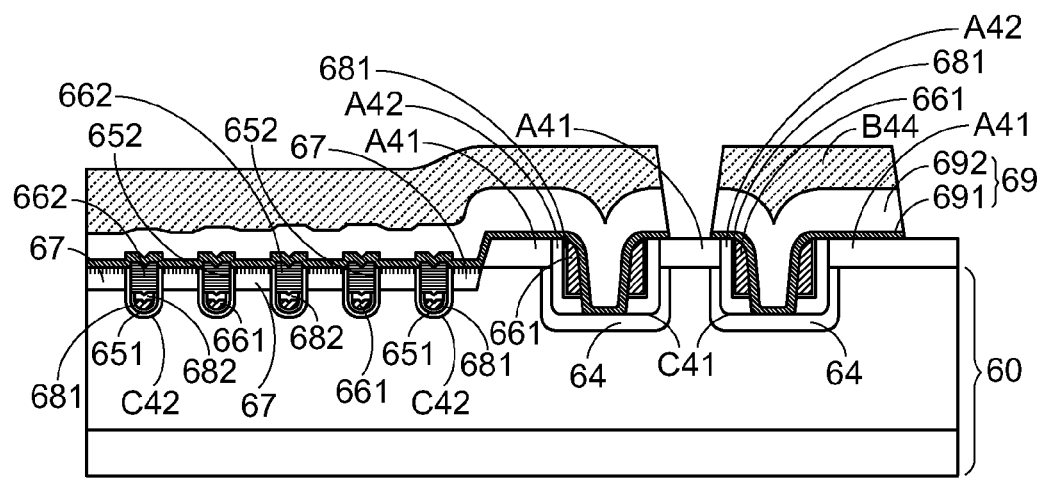
Figure 5K:
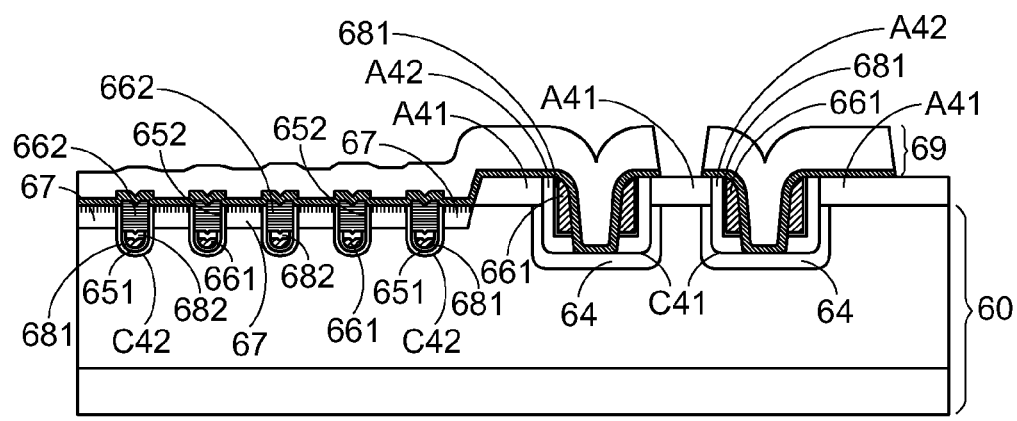

Then, as shown in FIG. 5J, a fourth photoresist layer B44 with a fourth photoresist pattern is formed on the metal sputtering layer 69. Then, the metal sputtering layer 69 uncovered by the fourth photoresist layer B44 is removed by a metal etching process. Consequently, the fourth photoresist pattern is transferred to the metal sputtering layer 69, and a part of the first mask layer A41 is exposed. That is, the region between two trenches of the first multi-trench structure C41 and the right edge of the metal sputtering layer 69 are etched, so that the first mask layer A41 is exposed. After the fourth photoresist layer B44 is removed, the resulting structure is shown in FIG. 5K. Moreover, after the metal sputtering process is done, a sintering process is performed to facilitate adhesion of the metal sputtering layer 39 to the associated structures. Afterwards, a wafer acceptance test (WAT) is performed to test the electrical property of the finished wafer.

The finished rectifier with a vertical MOS structure according to the fourth embodiment of the present invention is shown in FIG. 5K. The rectifier comprises a semiconductor substrate 60, a first mask layer A41, a second mask layer A42, a wet oxide layer 64, a gate oxide layer (including a first gate oxide layer 651 and a second gate oxide layer 652), a first polysilicon structure 661, a second polysilicon structure 662, a plurality of doped regions 67, a gate dielectric layer 681, a polysilicon oxide layer 682 and a metal sputtering layer 69. A first multi-trench structure C41 and a second multi-trench structure C42 are formed in the right side (i.e. the first side) and the left side (i.e. the second side) of the semiconductor substrate 60, respectively. The first mask layer A41 is formed on the right side of the semiconductor substrate 60 corresponding to the first multi-trench structure C41. The wet oxide layer 64 is formed in the semiconductor substrate 60 corresponding to the periphery of the first multi-trench structure C41. The second mask layer A42 is formed on the sidewalls of the first mask layer A41 and the wet oxide layer 64. The gate oxide layer (including a first gate oxide layer 651 and a second gate oxide layer 652) is formed on the surface of the second multi-trench structure C42. A first part of the gate dielectric layer 681 is formed on the sidewall of the second mask layer A42 corresponding to the first multi-trench structure C41. A second part of the gate dielectric layer 681 is formed on the surface of the first gate oxide layer 651 corresponding to the second multi-trench structure C42. A first part of the first polysilicon structure 661 is formed on the sidewall of the gate dielectric layer 681 corresponding to the first multi-trench structure C41. A second part of the first polysilicon structure 661 is formed on the second part of the gate dielectric layer 681 corresponding to the second multi-trench structure C42. The polysilicon oxide layer 682 is formed on the second part of the first polysilicon structure 661. The second polysilicon structure 662 is formed on the polysilicon oxide layer 682 and the second part of the gate dielectric layer 681. The doped regions 67 are formed on the region between the semiconductor substrate 60 and the second multi-trench structure C62, and located beside the first mask layer A41. The metal sputtering layer 69 is formed on the doped regions 67, the second gate oxide layer 652 and the second polysilicon structure 662 corresponding to the second multi-trench structure C42, and formed on the first mask layer A41, the second mask layer A42, the first part of the gate dielectric layer 681, the first part of the first polysilicon structure 661 and the wet oxide layer 64 corresponding to the first multi-trench structure C41. In addition, the first mask layer A41 is partially exposed.

In the rectifier with a vertical MOS structure according to the present invention, the device area or cell area with the ohmic contact is located at the left side (i.e. the second side) of the semiconductor substrate and effectively isolated from the external environment. The guard ring or termination structure with the mask layer is located at the right side (i.e. the first side) of the semiconductor substrate for blocking the current, so that the possibility of causing the leakage current problem is minimized.

Moreover, experiments demonstrate that the rectifier with a vertical MOS structure according to the present invention has low reverse-biased leakage current, low forward voltage drop, high reverse voltage and fast reverse recovery time. Consequently, by the rectifier and the manufacturing method of the present invention, the problems encountered from the prior art will be obviated.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A rectifier with a vertical MOS structure, the rectifier comprising:
    a semiconductor substrate, wherein a first multi-trench structure is formed in a first side of the semiconductor substrate, and a second multi-trench structure is formed in a second side of the semiconductor substrate;
    a wet oxide layer formed on a surface of the first multi-trench structure and in the semiconductor substrate;
    a mask layer formed on the first side of the semiconductor substrate corresponding to the first multi-trench structure and formed on the wet oxide layer;
    a gate oxide layer formed on a surface of the second multi-trench structure;
    a gate dielectric layer formed on a part of a surface of the gate oxide layer;
    a first polysilicon structure formed on the gate dielectric layer;
    a polysilicon oxide layer formed on the first polysilicon structure;
    a second polysilicon structure formed on the gate dielectric layer and the polysilicon oxide layer;
    a plurality of doping regions formed on a region between the semiconductor substrate and the second multi-trench structure, and located beside the mask layer; and
    a metal sputtering layer formed on the doped regions, the gate oxide layer and the second polysilicon structure corresponding to the second multi-trench structure, and formed on the mask layer corresponding to the first multi-trench structure, wherein the mask layer is exposed.

2. The rectifier as claimed in claim 1, wherein the semiconductor substrate comprises a heavily-doped (N+ type) silicon layer and a lightly-doped (N type) epitaxial layer formed on the heavily-doped silicon layer, and the first multi-trench structure and the second multi-trench structure are formed in the lightly-doped epitaxial layer.

3. The rectifier as claimed in claim 1, wherein each one of the doping regions includes a first ion implantation region form by using a deep doping process and a second ion implementation region form by using a shallow doping process, and the second ion implementation region is formed above the first ion implantation region.

4. The rectifier as claimed in claim 1, wherein the metal sputtering layer includes a first metal layer and a second metal layer covered on the first metal layer.

5. The rectifier as claimed in claim 4, wherein the first metal layer is made of titanium (Ti) or titanium nitride (TiN) and the second metal layer is made of aluminum/silicon/copper (Al/Si/Cu) alloy.

6. A rectifier with a vertical MOS structure, the rectifier comprising:
    a semiconductor substrate, wherein a first multi-trench structure is formed in a first side of the semiconductor substrate, and a second multi-trench structure is formed in a second side of the semiconductor substrate;
    a first mask layer formed on the first side of the semiconductor substrate corresponding to the first multi-trench structure;
    a wet oxide layer extended from a periphery of the first multi-trench structure into the semiconductor substrate;
    a second mask layer formed on sidewalls of the first mask layer and the wet oxide layer corresponding to the first multi-trench structure;
    a gate oxide layer formed on a surface of the second multi-trench structure;
    a gate dielectric layer, wherein a first part of the gate dielectric layer is formed on a sidewall of the second mask layer corresponding to the first multi-trench structure, and a second part of the gate dielectric layer is formed on a surface of the first gate oxide layer corresponding to the second multi-trench structure;
    a first polysilicon structure, wherein a first part of the first polysilicon structure is formed on a sidewall of the gate dielectric layer corresponding to the first multi-trench structure, and a second part of the first polysilicon structure is formed on the second part of the gate dielectric layer corresponding to the second multi-trench structure;
    a polysilicon oxide layer formed on the second part of the first polysilicon structure;

a second polysilicon structure formed on the polysilicon oxide layer and the second part of the gate dielectric layer;

a plurality of doping regions formed on a region between the semiconductor substrate and the second multi-trench structure, and located beside the first mask layer; and a metal sputtering layer formed on the doped regions, the gate oxide layer and the second polysilicon structure corresponding to the second multi-trench structure, and formed on the first mask layer, the second mask layer, the first part of the gate dielectric layer, the first part of the first polysilicon structure and the wet oxide layer corresponding to the first multi-trench structure, wherein the a part of the first mask layer is exposed.

7. The rectifier as claimed in claim 6, wherein the semiconductor substrate comprises a heavily-doped (N+ type) silicon layer and a lightly-doped (N type) epitaxial layer formed on the heavily-doped silicon layer, and the first multi-trench structure and the second multi-trench structure are formed in the lightly-doped epitaxial layer.

8. The rectifier as claimed in claim 6, wherein each one of the doping regions includes a first ion implantation region form by using a deep doping process and a second ion implementation region form by using a shallow doping process, and the second ion implementation region is formed above the first ion implantation region.

9. The rectifier as claimed in claim 6, wherein the metal sputtering layer includes a first metal layer and a second metal layer covered on the first metal layer.

10. The rectifier as claimed in claim 9, wherein the first metal layer is made of titanium (Ti) or titanium nitride (TiN) and the second metal layer is made of aluminum/silicon/copper (Al/Si/Cu) alloy.

* * * * *